(12) United States Patent
Phadke et al.

(10) Patent No.: US 12,355,439 B2
(45) Date of Patent: Jul. 8, 2025

(54) RESET INDEPENDENT GLITCH FILTER

(71) Applicant: QUALCOMM Incorporated, San Diego, CA (US)

(72) Inventors: Amod Phadke, Bangalore (IN); Vinay Kumar Garipelli, Bangalore (IN); Naveen Kumar Narala, Bengaluru (IN); Manjunath Kachenahalli Rangegowda, Bangalore (IN); Ravi Shankar Srinivasan, Chennai (IN)

(73) Assignee: QUALCOMM INCORPORATED, San Diego, CA (US)

( * ) Notice: Subject to any disclaimer, the term of this patent is extended or adjusted under 35 U.S.C. 154(b) by 292 days.

(21) Appl. No.: 18/324,785

(22) Filed: May 26, 2023

(65) Prior Publication Data

US 2024/0396551 A1 Nov. 28, 2024

(51) Int. Cl.
*H03K 19/003* (2006.01)
*H03K 19/096* (2006.01)
*H03K 19/20* (2006.01)

(52) U.S. Cl.
CPC ..... *H03K 19/00361* (2013.01); *H03K 19/096* (2013.01); *H03K 19/20* (2013.01)

(58) Field of Classification Search
CPC ........... H03K 19/003; H03K 19/00361; H03K 19/08; H03K 19/094; H03K 19/096; H03K 19/20; H03K 19/21; H03K 5/125; H03K 5/1252; H03K 21/40; H03K 21/406; H03K 23/40; H03K 23/58
See application file for complete search history.

(56) References Cited

U.S. PATENT DOCUMENTS

| | | | |
|---|---|---|---|
| 2019/0379368 A1* | 12/2019 | Lin | H03K 5/1252 |
| 2020/0033406 A1* | 1/2020 | Wang | H03K 21/38 |
| 2021/0119621 A1* | 4/2021 | Bal | H03K 19/00346 |
| 2023/0253779 A1* | 8/2023 | Nemiroff | G06F 21/552 361/92 |
| 2024/0396551 A1* | 11/2024 | Phadke | H03K 19/00361 |
| 2025/0112626 A1* | 4/2025 | Fayneh | H03K 5/135 |

* cited by examiner

*Primary Examiner* — Jason M Crawford
(74) *Attorney, Agent, or Firm* — Loza & Loza, LLP

(57) ABSTRACT

A glitch filtering circuit has a counting circuit configured to provide one or more counter output signals indicating whether an input signal has remained in a first signaling state or in a second signaling state for a preconfigured duration of time; a flipflop clocked by a clock signal and configured to provide an output of the glitch filtering circuit; a threshold detect circuit configured to generate a select signal based on the one or more counter output signals; and a multiplexer configured to provide a multiplexed signal to an input of the flipflop, the multiplexed signal having a signaling state that is selected in accordance with the select signal from an input fixed at the first signaling state, an input fixed at the second signaling state and an input that is coupled to the output of the glitch filtering circuit.

30 Claims, 10 Drawing Sheets

RESET INDEPENDENT GLITCH FILTER

TECHNICAL FIELD

The present disclosure relates generally to transitions between operational states of integrated circuits and more particularly to techniques for preventing corruption during transitions between operational states.

BACKGROUND

Mobile communication devices may include a variety of components including circuit boards, integrated circuit (IC) devices and/or System-on-Chip (SoC) devices. The components may include processing devices, user interface components, storage and other peripheral components. State-of-the-art mobile application devices demand a small form factor, low cost, a tight power budget, and high electrical performance. For example, wearable processing and communication devices require SoCs and other IC devices that offer higher performance with reduced power requirements in smaller form-factors. Mobile package design has evolved to meet these divergent goals for enabling mobile applications that support multimedia enhancements that can be used in mobile communication devices such as smartphones and smart watches, and in a variety of vehicles, sensor management systems, for example.

Certain devices that are subject to power consumption budgets may be operable at different clock speeds and/or voltage levels in different operational states. For example, battery powered mobile communication handsets typically support full-power, low-power and sleep modes of operation that can be selected based on operational state of the handset, temperature levels within the handset and remaining battery capability or availability of external power supplies.

In low-power, idle and/or sleep modes, some circuits and peripherals may be powered down to preserve battery power, while other circuits and peripherals may be operated at full-power or reduced power to maintain necessary functions and/or necessary subsystems. In one example, certain wireless network communication transceivers and user interfaces may be considered necessary functions in a mobile communication handset or vehicle management system. In another example, a vehicle control system or sensor management system may be maintained in an operational state or continually awakened during low-power, idle and/or sleep modes. In another example, it may be necessary to maintain operation of memory subsystems to preserve configuration, state and control information used by a mobile communication handset.

Transitions from low-power, idle and/or sleep modes can require that certain circuits be reset or rebooted to ensure a known and valid operation state is accomplished after the transitions. Surges in power usage and indeterminate states of certain circuits can result in temporary unintended changes in state (glitches) of signals used to control or access critical subsystems. Glitches may be short-lived but may nevertheless cause corruption of memory or loss of state information in critical subsystems. There is an ongoing need to improve power management circuits to prevent glitches and other unintended changes in state during transitions from low-power modes.

SUMMARY

Certain aspects of the disclosure relate to systems, apparatus, methods and techniques that can provide secure access control for devices such as power management devices.

In various aspects of the disclosure, a glitch filtering circuit includes a counting circuit configured to provide one or more counter output signals indicating whether an input signal has remained in a first signaling state or in a second signaling state for a preconfigured duration of time; a flipflop clocked by a clock signal and configured to provide an output of the glitch filtering circuit; a threshold detect circuit configured to generate a select signal based on the one or more counter output signals; and a multiplexer configured to provide a multiplexed signal to an input of the flipflop, the multiplexed signal having a signaling state that is selected in accordance with the select signal from an input fixed at the first signaling state, an input fixed at the second signaling state and an input that is coupled to the output of the glitch filtering circuit. In some instances, a reset input of the flipflop may be disabled.

In various aspects of the disclosure, a method or filtering glitches from an input signal includes providing one or more counter output signals indicating whether an input signal has remained in a first signaling state or in a second signaling state for a preconfigured duration of time; generating a select signal based on state of the one or more counter output signals; and providing a multiplexed signal to an input of a flipflop that is clocked by a clock signal, the multiplexed signal having a signaling state that is selected in accordance with the select signal from an input fixed at the first signaling state, an input fixed at the second signaling state and an input that is coupled to an output of the flipflop.

In various aspects of the disclosure, a processor-readable storage medium has one or more instructions that, when executed by at least one processor of a processing circuit, cause the processing circuit to provide one or more counter output signals indicating whether an input signal has remained in a first signaling state or in a second signaling state for a preconfigured duration of time; generate a select signal based on state of the one or more counter output signals; and provide a multiplexed signal to an input of a flipflop that is clocked by a clock signal, the multiplexed signal having a signaling state that is selected in accordance with the select signal from an input fixed at the first signaling state, an input fixed at the second signaling state and an input that is coupled to an output of the flipflop.

In various aspects of the disclosure, an apparatus includes means for providing one or more counter output signals indicating whether an input signal has remained in a first signaling state or in a second signaling state for a preconfigured duration of time, means for generating a select signal based on state of the one or more counter output signals, and means for providing a multiplexed signal to an input of a flipflop that is clocked by a clock signal, the multiplexed signal having a signaling state that is selected in accordance with the select signal from an input fixed at the first signaling state, an input fixed at the second signaling state and an input that is coupled to an output of the flipflop.

In certain aspects, the counting circuit includes a first counter configured to count cycles of the clock signal when the input signal is in the first signaling state, and a second counter configured to count cycles of the clock signal when the input signal is in the second signaling state. The one or more counter output signals may include a first multibit signal indicative of an output of the first counter, and a second multibit signal indicative of an output of the second counter. The threshold detect circuit may be configured to generate the select signal by comparing the first multibit signal with a first threshold duration and the second multibit signal with a second threshold duration. The one or more counter output signals may include a first signal that is asserted when the input signal is in the first signaling state for a first threshold duration, and a second signal that is asserted when the input signal is in the second signaling state for a second threshold duration. The threshold detect circuit may be configured to generate the select signal based on a signaling state of the first signal and a signaling state of the second signal.

In certain aspects, the counting circuit may include a counter configured to count up when the input signal is in the first signaling state and to count down when the input signal is in the second signaling state. The one or more counter output signals may include a multibit signal indicative of a count value of the counter. The threshold detect circuit may be configured to generate the select signal by comparing the multibit signal with a threshold duration. The one or more counter output signals may include a first signal that is asserted when the input signal is in the first signaling state for a first threshold duration, and a second signal that is asserted when the input signal is in the second signaling state for a second threshold duration. The threshold detect circuit may be configured to generate the select signal based on a signaling state of the first signal and a signaling state of the second signal.

In certain aspects, the multiplexed signal has a signaling state that is selected in accordance with the select signal from an input fixed at the first signaling state, an input fixed at the second signaling state and an input that is coupled to the output of the glitch filtering circuit.

In certain aspects, a logic circuit is configured to provide state information related to operation of the glitch filtering circuit. The state information may include information indicating that the output of the glitch filtering circuit is a stable representation of the signaling state of the input signal.

DETAILED DESCRIPTION

Figure 1:
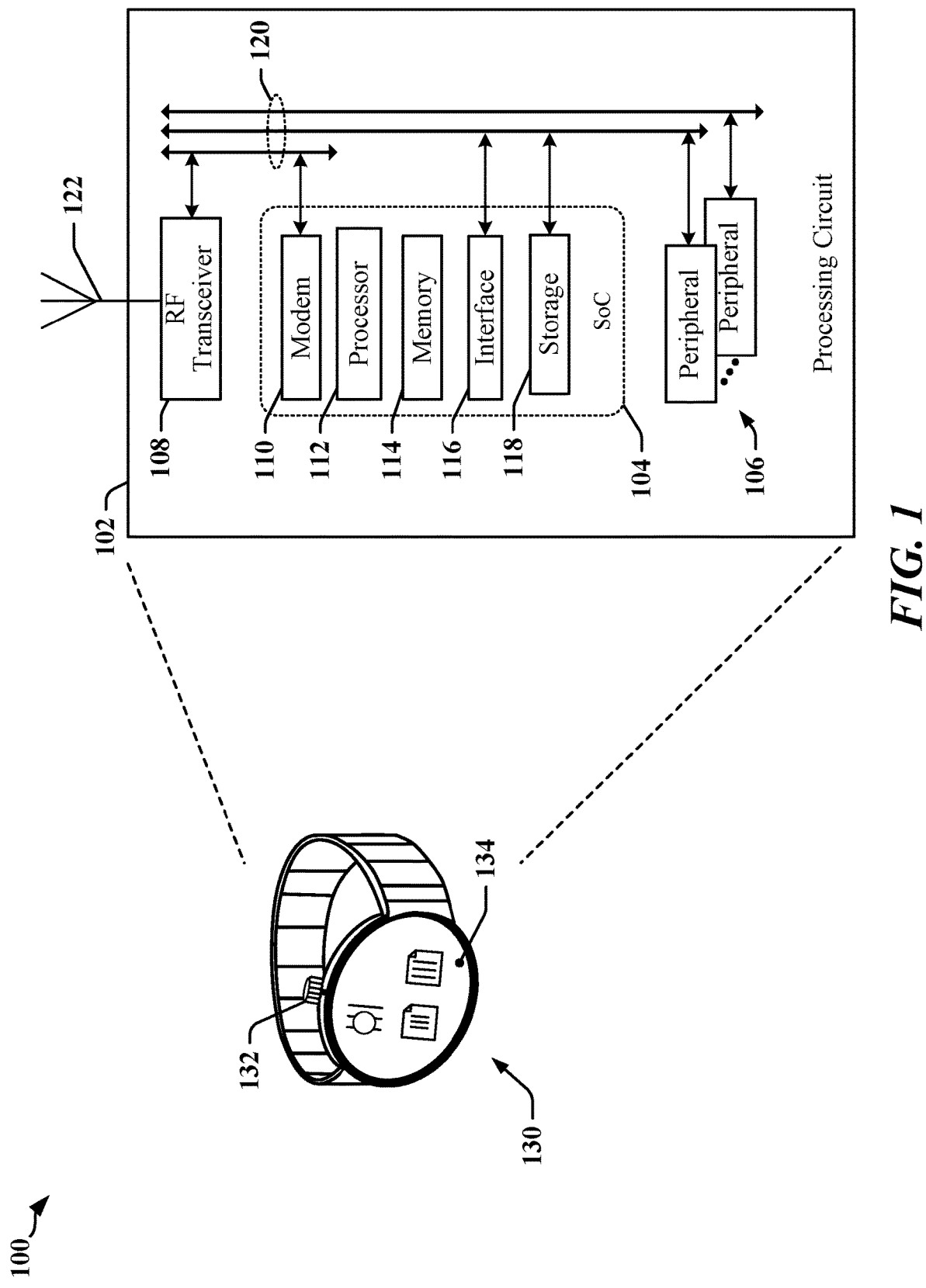
FIG. 1 illustrates an example of an apparatus 100 that may be configured or adapted in accordance with certain aspects of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

In many systems, a power management integrated circuit (PMIC) is used to control the flow of power to different components and circuits. A PMIC, or multiple interconnected PMICs may be configured to manage the power consumption of System-on-Chip (SoC) devices, application specific integrated circuit (ASIC) devices, peripherals and other circuits. The PMIC may control of power flowing to SoCs or other devices in order to exert an influence on system performance, battery longevity and temperature within housings of the system. A PMIC may be configured through a serial bus by a host or primary SoC or by another managing PMIC using transactions conducted in accordance with system power management interface (SPMI) protocols, for example.

Many systems provide a high-speed power domain that supports operation at the highest possible operating frequency enabled by the process technology. In some examples, the operating frequency of circuits in a high-speed power domain may be constrained by a power budget and the operating frequency of some circuits may be configured to operate at the highest frequency that can be supported under the power budget. Lower power consumption in high-speed circuits can be achieved by reducing the operating voltage of the high-speed power domain.

Some systems provide a low-power island that can support, supply and/or be included in a section of the IC or SoC that performs real-time, low-frequency, and/or low data rate communication and that includes processing circuits associated with performance of real-time, low-frequency, and/or low data rate communication tasks and functions. In one example, the low-power island may supply power to circuits and devices used for communication and processing functions associated with certain types of sensors. In another example, the low-power island may supply power to circuits and devices used for low data rate communication and processing.

Certain aspects of this disclosure provide glitch filters that can effectively suppress transient state on control signals during system exit from certain sleep modes. An SoC or other device may reduce power consumption by entering an idle or sleep mode. In the idle or sleep mode, certain circuits may be disabled and other circuits may be operated at reduced voltage levels and/or reduced clock rates. Transitions between power modes can cause control signals to experience glitches or temporary indeterminate or undesired states while power levels are modified and circuits are disabled or enabled. Glitches and other disruptions of control signals can cause corruption of data in memory devices and can require reset of peripherals and memory subsystems.

Certain aspects of this disclosure may be implemented in electronic devices and circuits that are subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle or vehicle component, a wearable computing device (e.g., a smart watch, a health or fitness tracker, eyewear, etc.), an appliance, a sensor, a security device, a vending machine, a smart meter, or any other similar functioning device.

FIG. 1 illustrates an example of an apparatus 100 that may be configured or adapted in accordance with certain aspects of this disclosure. The apparatus 100 can be enclosed within or embodied in a wearable device, such as the illustrated smartwatch 130. Various aspects of this disclosure relate equally to other apparatus, including circuits and systems that are deployed within a vehicle such as an automobile. A processing circuit 102 of the apparatus 100 includes multiple circuits or devices 104, 106 and/or 108. In various examples, the processing circuit 102 is implemented using one or more ASICs, chiplets, an SoC or other devices arranged in a configuration that can be adapted for use in mobile computing, embedded computing and/or edge computing. In one example, the apparatus 100 may be configured to support multiple communication technologies, modes or protocols and the processing circuit 102 includes a combination of devices including an SoC 104, one or more peripheral devices 106, and a transceiver 108 that cooperate to enable the apparatus to communicate through an antenna 122 with a radio access network, a core access network, the Internet and/or another network.

The SoC 104 may include one or more processors 112, one or more modems 110, on-board memory 114, a bus interface circuit 116 and/or other logic circuits or functions. The processing circuit 102 may be controlled by an operating system that provides an application programming interface (API) layer that enables the one or more processors 112 to execute software modules residing in the on-board memory 114 or other processor-readable storage 118 provided on the processing circuit 102. The software modules may include instructions and data stored in the on-board memory 114 or processor-readable storage 118. The SoC 104 may access its on-board memory 114, the processor-readable storage 118, and/or storage external to the processing circuit 102. The on-board memory 114, the processor-readable storage 118 may include read-only memory (ROM) or random-access memory (RAM), electrically erasable programmable ROM (EEPROM), flash cards, or any memory device that can be used in processing systems and computing platforms. The processing circuit 102 may include, implement, or have access to a local database or other parameter storage that can maintain operational parameters and other information used to configure and operate the apparatus 100 and/or the processing circuit 102. The local database may be implemented using registers, a database module, flash memory, magnetic media, EEPROM, soft or hard disk, or the like. The processing circuit 102 may also be operably coupled to external devices such as the antenna 122, a display 134, operator controls 132, switches or buttons, among other components. A user interface module may be configured to manage the display 134, operator controls 132, etc. and may communicate with other elements of the processing circuit 102 through one or more serial data interconnects.

The processing circuit 102 may provide multiple buses 120 that enable communication between two or more devices 104, 106, and/or 108. In one example, the SoC 104 may include bus interface circuits 116 coupled to one or more of the buses 120. Each of the bus interface circuits 116 may include a combination of circuits, counters, timers, control logic and other configurable circuits or modules. In one example, certain bus interface circuits 116 may be configured to operate in accordance with standards-defined communication specifications or protocols. The processing circuit 102 may include or control a power management function that configures and manages the operation of the apparatus 100. Power management is an important function for battery operated or supported systems and apparatus, including portable or wearable devices, vehicle control systems or subsystems, sensors, security monitoring devices and so on.

The illustrated smartwatch 130 is one type of portable or wearable device (referred to collectively with portable or wearable processing devices as portable communication devices or PCDs), sensors, instruments, appliances and other such devices include one or more ICs. Portable communication devices may include mobile phones, tablet computers, palmtop computers, portable digital assistants (PDAs), portable game consoles, and other portable electronic devices. PCDs commonly contain integrated circuits or SoCs that include numerous components or subsystems designed to work together to deliver functionality to a user. The various SoC subsystems may communicate with each other via one or more intra-chip data buses or similar data communication interconnects. PCDs may have multiple SoCs that communicate with each other via similar inter-chip interconnects. The ICs are typically packaged in an IC package, which may be referred to as a "semiconductor package" or "chip package." The IC package typically includes a package substrate and one or more IC chips or other electronic modules mounted to the package substrate to provide electrical connectivity to the IC chips. For example, an IC chip in an IC package may be configured as an SoC. The IC chips are electrically coupled to other IC chips and/or to other components in the IC package through electrical coupling to metal lines in the package substrate. The IC chips can also be electrically coupled to other circuits outside the IC package through electrical connections of external metal interconnects (e.g., solder bumps) of the IC package.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs. Design rules for newer process technology that use low-voltage transistors may preclude the use of higher voltage transistors supported by previous process technology generations.

Figure 2:
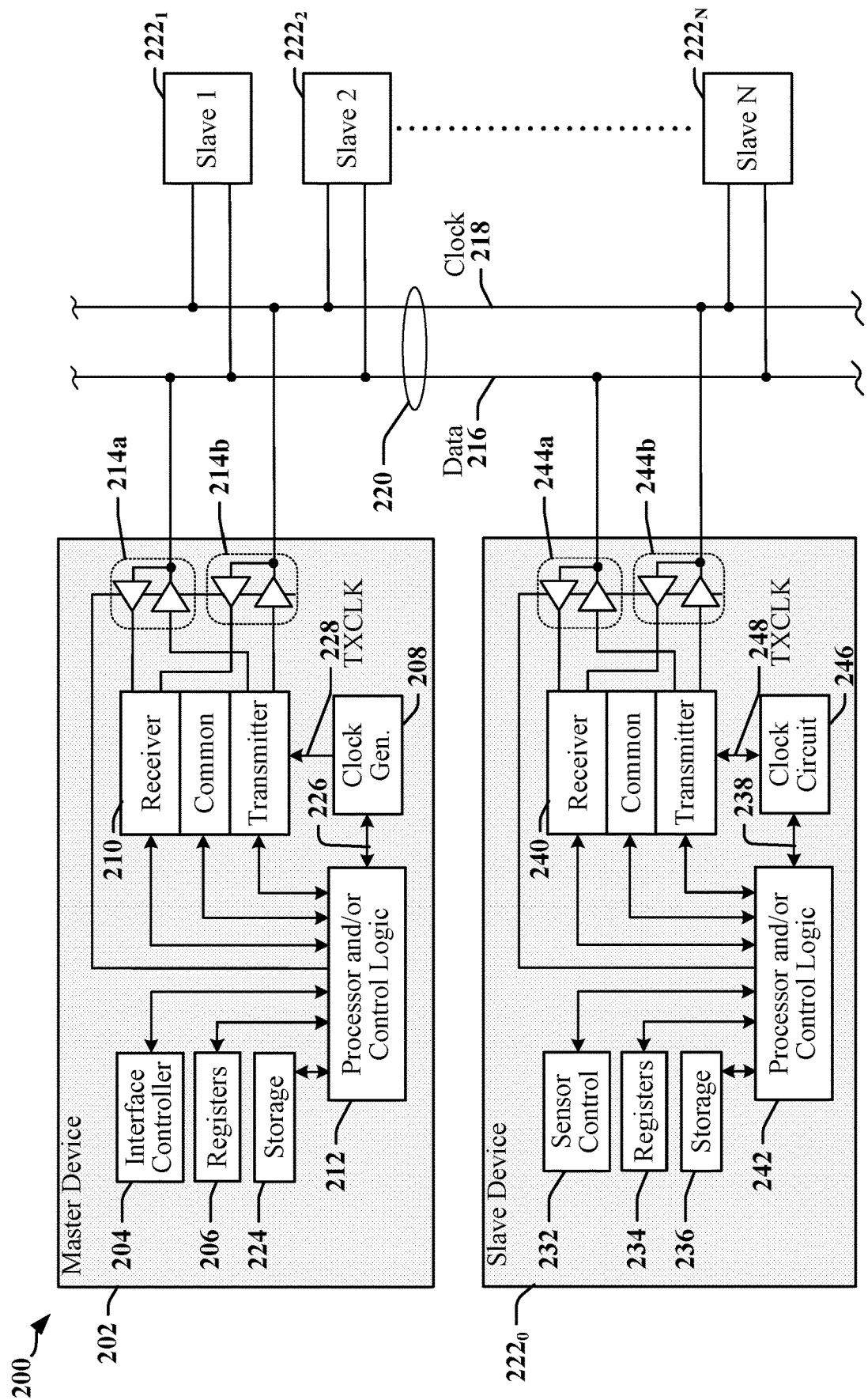
FIG. 2 illustrates a system architecture for an apparatus employing a data link between IC devices.

FIG. 2 illustrates certain aspects of an apparatus 200 that includes multiple devices 202, and $222_0$-$222_N$ coupled to a serial bus 220. The devices 202 and $222_0$-$222_N$ may be implemented in one or more semiconductor IC devices, such as applications processors, SoCs or ASICs. In various implementations the devices 202 and $222_0$-$222_N$ may include, support or operate as a modem, a signal processing device, a display driver, a camera, a user interface, a sensor, a sensor controller, a media player, a transceiver, and/or other such components or devices. In some examples, one or more of the slave devices $222_0$-$222_N$ may be used to control, manage or monitor a sensor device. Communications between devices 202 and $222_0$-$222_N$ over the serial bus 220 is controlled by a bus master device 202. Certain types of bus can support multiple bus masters.

In one example, a bus master device 202 may include an interface controller 204 that may manage access to the serial bus, configure dynamic addresses for slave devices $222_0$-$222_N$ and/or generate a clock signal 228 to be transmitted on a clock line 218 of the serial bus 220. The bus master device 202 may include configuration registers 206 or other storage 224, and other control logic 212 configured to handle protocols and/or higher level functions. The control logic 212 may include a processing circuit such as a state machine, sequencer, signal processor or general-purpose processor. The bus master device 202 includes a transceiver 210 and line drivers/receivers 214a and 214b. The transceiver 210 may include receiver, transmitter and common circuits, where the common circuits may include timing, logic and storage circuits and/or devices. In one example, the transmitter encodes and transmits data based on timing in the clock signal 228 provided by a clock generation circuit 208. Other timing clocks 226 may be used by the control logic 212 and other functions, circuits or modules.

At least one device $222_0$-$222_N$ may be configured to operate as a slave device on the serial bus 220 and may include circuits and modules that support a display, an image sensor, and/or circuits and modules that control and communicate with one or more sensors that measure environmental conditions. In one example, a slave device $222_0$ configured to operate as a slave device may provide a control function, module or circuit 232 that includes circuits and modules to support a display, an image sensor, and/or circuits and modules that control and communicate with one or more sensors that measure environmental conditions. The slave device $222_0$ may include configuration registers 234 or other storage 236, control logic 242, a transceiver 240 and line drivers/receivers 244a and 244b. The control logic 242 may include a processing circuit such as a state machine, sequencer, signal processor or general-purpose processor. The transceiver 210 may include receiver, transmitter and common circuits, where the common circuits may include timing, logic and storage circuits and/or devices. In one example, the transmitter encodes and transmits data based on timing in a clock signal 248 provided by clock generation and/or recovery circuits 246. The clock signal 248 may be derived from a signal received from the clock line 218. Other timing clocks 238 may be used by the control logic 242 and other functions, circuits or modules.

The serial bus 220 may be operated in accordance with I2C, I3C, SPMI, RFFE, and/or other protocols. A bus master manages communication over the serial bus 220, and typically provides a clock signal that is used to control timing of transmissions. In various examples, one or more devices may be capable of operating as a bus master and devices may contend for control of the serial bus 220 in order to conduct a transaction. In the illustrated example, a bus master device 202 may execute a transaction with one or more slave devices $222_0$-$222_N$ coupled to the serial bus 220.

In an example where the serial bus 220 is operated in accordance with an I3C protocol, devices that communicate using the I3C protocol can coexist on the same serial bus 220 with devices that communicate using I2C protocols. The I3C protocols may support different communication modes, including a single data rate (SDR) mode that is compatible with I2C protocols. High-data-rate (HDR) modes may provide a data transfer rate between 6 megabits per second (Mbps) and 16 Mbps, and some HDR modes may be provide higher data transfer rates. I2C protocols may conform to de facto I2C standards providing for data rates that may range between 100 kilobits per second (kbps) and 3.2 Mbps. I2C and I3C protocols may define certain electrical and timing aspects of signals transmitted on the serial bus 220, in addition to data formats and aspects of bus control. In some aspects, the I2C and I3C protocols may define direct current (DC) characteristics affecting certain signal levels associated with the serial bus 220, and/or alternating current (AC) characteristics affecting certain timing aspects of signals transmitted on the serial bus 220. In some examples, a 2-wire serial bus 220 transmits data on a data line 216 and a clock signal on the clock line 218. In some instances, data may be encoded in the signaling state, or transitions in signaling state of the data line 216 and the clock line 218.

A PMIC may communicate with other devices and circuits using a multi-drop interface such as the SPMI, the I3C interface, and the Radio Frequency Front-End (RFFE) interface or another interface defined by the Mobile Industry Processor Interface (MIPI) Alliance. The PMIC may communicate using a different type of interface, including a proprietary interface or an interface defined by a different standards body. Protocols that support communication over a multi-drop serial bus define a datagram structure used to transmit command, control and data payloads. Datagram structures for different protocols define certain common features, including addressing used to select devices to receive or transmit data, clock generation and management, interrupt processing and device priorities.

Figure 3:
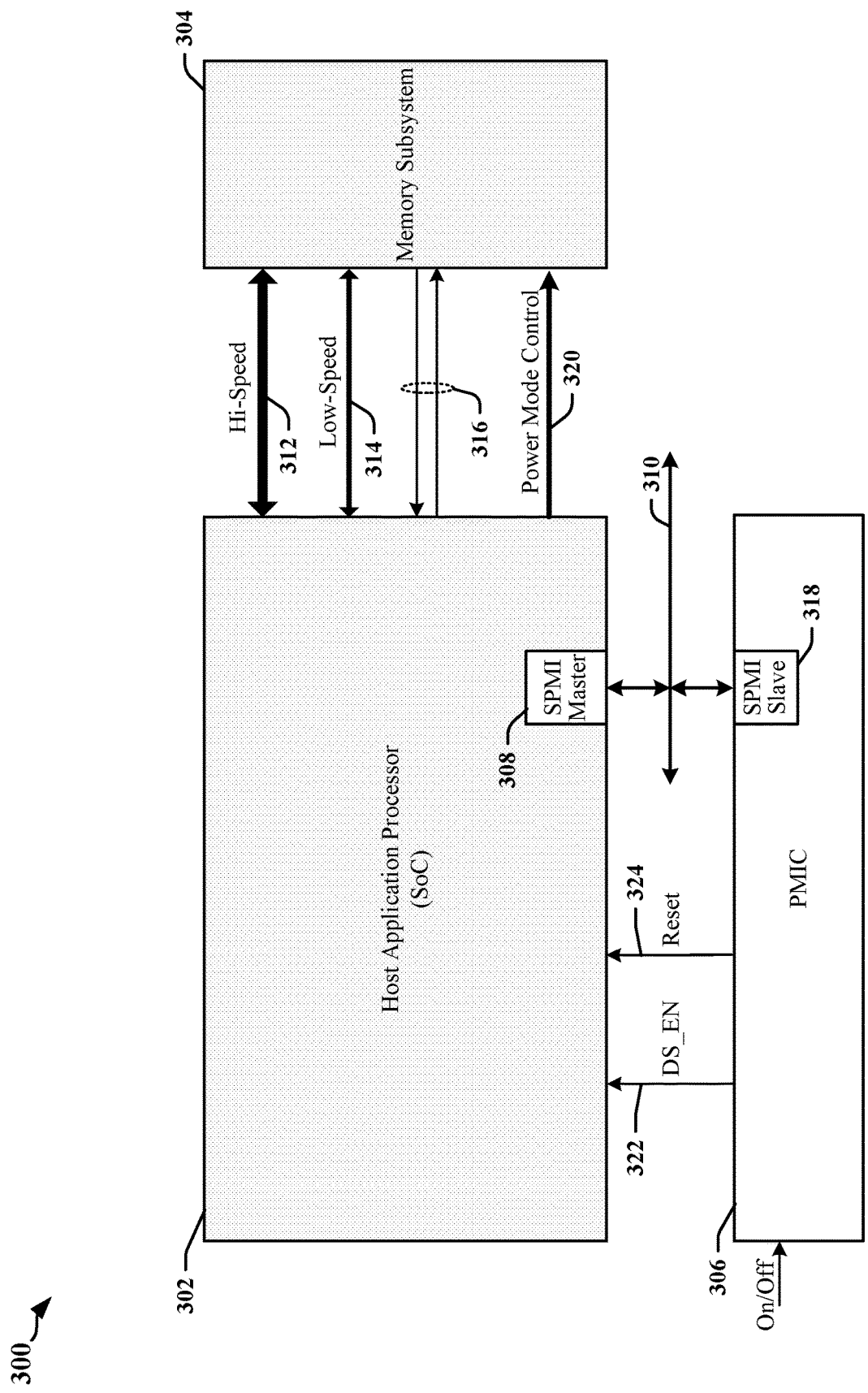
FIG. 3 illustrates an example of a system that may be adapted or configured in accordance with certain aspects of this disclosure.

FIG. 3 illustrates an example of a system 300 that may be adapted or configured in accordance with certain aspects of this disclosure. The system 300 may include an SoC 302 that can include or serve as an application processor or host device on various communication links. The communication links may be implemented using one or more serial buses 310, 312, 314, 316, which can be operated in accordance with a standards-based or proprietary protocol. The system 300 may have one or more peripherals 304 and a PMIC 306. In the illustrated system 300, the peripheral 304 is coupled to the SoC 302 using a high-speed bus 312, low-speed bus 314 and a character-based link 316 implemented using universal asynchronous receiver/transmitters (UARTs) for example. The PMIC 306 is coupled to the SoC 302 over a serial bus 310 through the SPMI bus master 308 and SPMI slave 318. The SPMI bus master 308 manages and controls operations on the serial bus 310 in accordance with SPMI protocols defined by the MIPI Alliance. The SPMI protocols enable serial buses to operate as shared buses that provide high-speed, low-latency connection for a variety of devices or device types and enable data transmissions to be managed according to priorities assigned to different traffic classes. In some examples, the low-speed bus 314 may be configured as a serial bus and operated in accordance with I2C protocols.

While SPMI protocols may be used to implement a general-purpose communication link, the serial bus 310 operated in accordance with SPMI protocols provides a power management control bus that can communicate commands to cause circuits and/or functional components to reset, sleep, shutdown, wakeup, and so on. SPMI protocols provide for between one and four master devices to be coupled to the serial bus and can support up to 16 slave devices. In the illustrated system 300, the PMIC 306 can provide one or more signals that can initiate, indicate or select a power mode for the SoC 302 or that can terminate a power mode for the SoC 302. In one example, the PMIC 306 provides a deep sleep mode signal (the DS_EN signal 322) that indicates when the SoC 302 should enter and remain in deep sleep mode.

An SoC 302 configured in accordance with certain aspects of this disclosure may turn off its core and/or primary power rails such that most or all circuits in the SoC 302 are disabled and powered down. The SoC 302 may continue to power some "always-on" circuits that are needed to monitor a user interface, certain sensors and/or a communication interface. The memory subsystem 304 may include or support a memory that requires refreshing to maintain memory integrity, such as Double Data Rate Synchronous Dynamic Random-Access Memory (DDR SDRAM), Low Power DDR SDRAM (LPDDR SDRAM), etc. In the illustrated example, the SoC 302 may be required to maintain the memory subsystem 304 in a self refresh (SRF) mode to preserve memory contents. In some instances, the memory subsystem 304 may internally generate certain control signals in the SRF mode. SRF may be activated, for example, when the SoC 302 enters a low-power mode.

The SoC 302 may assert DS_EN 322 to keep the memory subsystem 304 in the SRF mode and to allow rest of SoC 302 to enter a low power mode. The SoC 302 can power-down memory interface circuits that would otherwise provide the control signals necessary to refresh memory in the memory subsystem 304. The SoC 302 may use always-on circuits to drive the DS_EN signal 322 and/or other control signals 320.

The PMIC 306 may cause the SoC 302 to exit the deep sleep mode by asserting a reset signal 324 that cause the SoC 302 to initialize and start operations in a controlled procedure that may be referred to as the boot procedure. A conventional cold boot procedure is executed after a hardware or software reset signal is asserted. The cold boot procedure may establish an initial operating point for the SoC 302 where parameters, registers and memory are cleared or set to initial values defined by a designer. In some implementations, a quick-boot procedure is defined for use when the SoC 302 exits deep sleep mode. The quick-boot procedure may be executed instead of the cold boot procedure when the DS_EN signal 322 is asserted when reset is asserted. For example, the DS_EN signal 322 may be asserted by the PMIC 306 to cause the SoC 302 to enter the deep sleep mode and the PMIC 306 may continue to assert the DS_EN signal 322 until the SoC 302 has fully executed the quick-boot procedure or the cold boot procedure.

The SoC 302 may avoid resetting or reconfiguring the memory subsystem 304 while executing the quick-boot procedure in order to avoid the risk of corrupting memory. For example, the SoC 302 is typically required to avoid terminating self-refresh mode in the memory subsystem 304 until the quick-boot procedure is completed and the SoC 302 has configured control signals necessary to refresh memory in the memory subsystem 304.

The SoC 302 can typically recommence operations after executing the quick-boot procedure without delays needed to configure circuits, registers and interfaces that were operational before entry into deep sleep mode. In conventional systems, the duration of a typical cold boot can be measured in multiple tens of seconds, which can lead to unsatisfactory performance in ultra low power use cases. Ultra-low power use cases include certain automotive and wearable systems that have maximum wakeup latencies specified in hundreds of milliseconds. In one example, specifications for vehicle control systems require low wakeup latency when exiting parking modes. In another example, processing systems in smart watches require low wakeup latency when exiting to wrist down or nighttime modes.

The advantages of quick-boot procedures over cold boot procedures can be lost when glitches occur on control signals after a reset has been asserted. Glitches can occur due to changes in power rail voltage levels or due to indeterminate or transitory states of circuits that are activated upon exit from deep sleep mode. All signals provided by the PMIC 306 are susceptible to glitches. For example, circuits in the SoC 302 that receive or process the DS_EN signal 322 may experience transitory instability during power rail excursions, resulting in a glitch that affects the determination of state of the DS_EN signal 322 by the SoC 302 when reset is asserted. In one example, the SoC 302 may incorrectly determine that DS_EN signal 322 is not asserted and commence a cold boot procedure. In another example, a glitch on the DS_EN signal 322 during exit from deep sleep mode can result in data corruption within the memory due to prematurely terminated SRF. The detection of corrupted data may trigger a cold boot with its high latency.

The effects of glitches on the DS_EN signal 322 can cause a system to violate low latency specifications when the glitches result in execution of a cold boot. In some implementations, a glitch filter is used to suppress temporary unintended changes in the state of the DS_EN signal 322 signals during exits from deep sleep mode.

Figure 4:
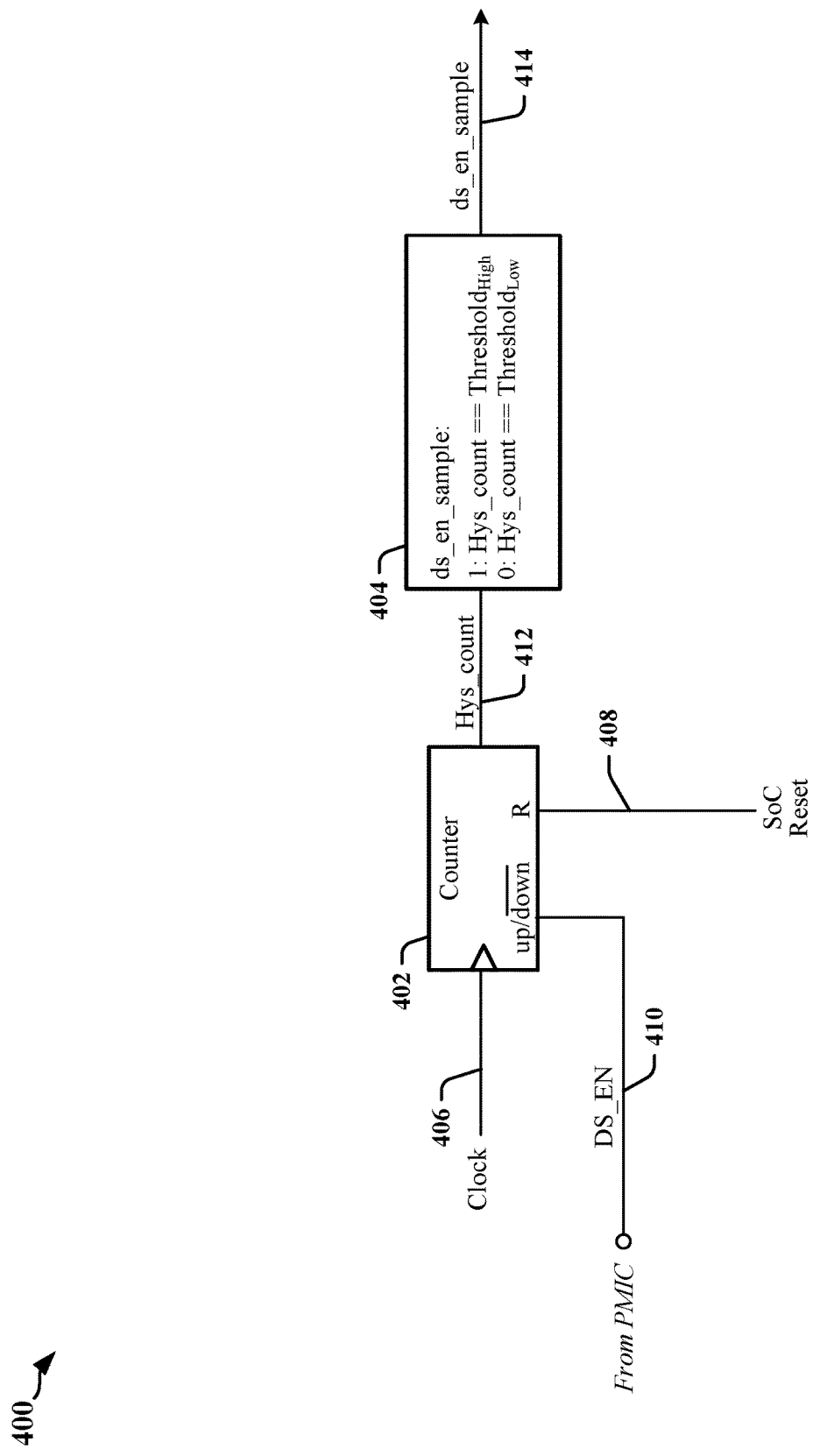
FIG. 4 illustrates the operation of a conventional glitch filtering circuit.

FIG. 4 illustrates the operation of a conventional glitch filtering circuit 400 implemented in an SoC. The conventional glitch filtering circuit 400 includes a counter 402 and threshold detect logic 404. The counter 402 may be implemented using an up/down counter that may be referred to as a hysteresis counter. The DS_EN signal 410 received from a PMIC controls the direction of count of the counter 402. In the illustrated example, the counter 402 counts up when the DS_EN signal 410 is asserted and counts down when the DS_EN signal 410 is not asserted. The counter 402 counts cycles of a clock signal 406 provided by the SoC. The count value of the counter 402 increases for every clock cycle or at edges of the clock signal 406 while the DS_EN signal 410 is asserted. The count value of the counter 402 decreases for every clock cycle or at edges of the clock signal 406 while the DS_EN signal 410 is not asserted. Glitches in the DS_EN signal 410 may be missed if they are sufficiently short and may otherwise cause the counter to change direction while the glitch affects the DS_EN signal 410. The period of the clock signal 406 may be selected to limit the effect of a glitch.

The output 412 of the counter 402 may be provided to the threshold detect logic 404. The output 412 of the counter 402 may include the entire count value of the counter 402 or may indicate that a certain count value has been reached. In one example, the output 412 of the counter 402 includes a most significant bit (MSB) and a signal indicating zero value. In this example, the counter 402 may be configured to count up until the MSB is set or count down until the signal indicating zero value is set. Counting may be resumed when a change in the state of the DS_EN signal 410 occurs.

The output 414 of the threshold detect logic 404 may be configured to provide a filtered or sampled version of the DS_EN signal 410. In one example, the threshold detect logic 404 compares all bits of the counter 402 with upper and lower thresholds and may set the output 414 of the threshold detect logic 404 when the upper threshold is reached and clear the output 414 of the threshold detect logic 404 when the lower threshold is reached. In another example, the output 414 of the threshold detect logic 404 is set when the MSB (for example) of the counter 402 is set and cleared when a signal indicating zero value (for example) is set. The effect of glitches in the DS_EN signal 410 can be limited to increasing the delay before a change in the DS_EN signal 410 is propagated to the output 414 of the threshold detect logic 404.

The conventional glitch filtering circuit 400 may be susceptible to the effects of chip-wide resets within the SoC 302. For example, a chip-wide reset signal 408 may be coupled to the counter 402 in order to enable the SoC to initialize the counter 402 during system initialization. The effect of the chip-wide reset signal 408 may disrupt control signals provided to a memory subsystem and cause SRF operations to be terminated or interrupted, by the memory subsystem resulting in corruption of memory. Detection of memory corruption typically results in performance of a cold boot procedure.

Figure 5:
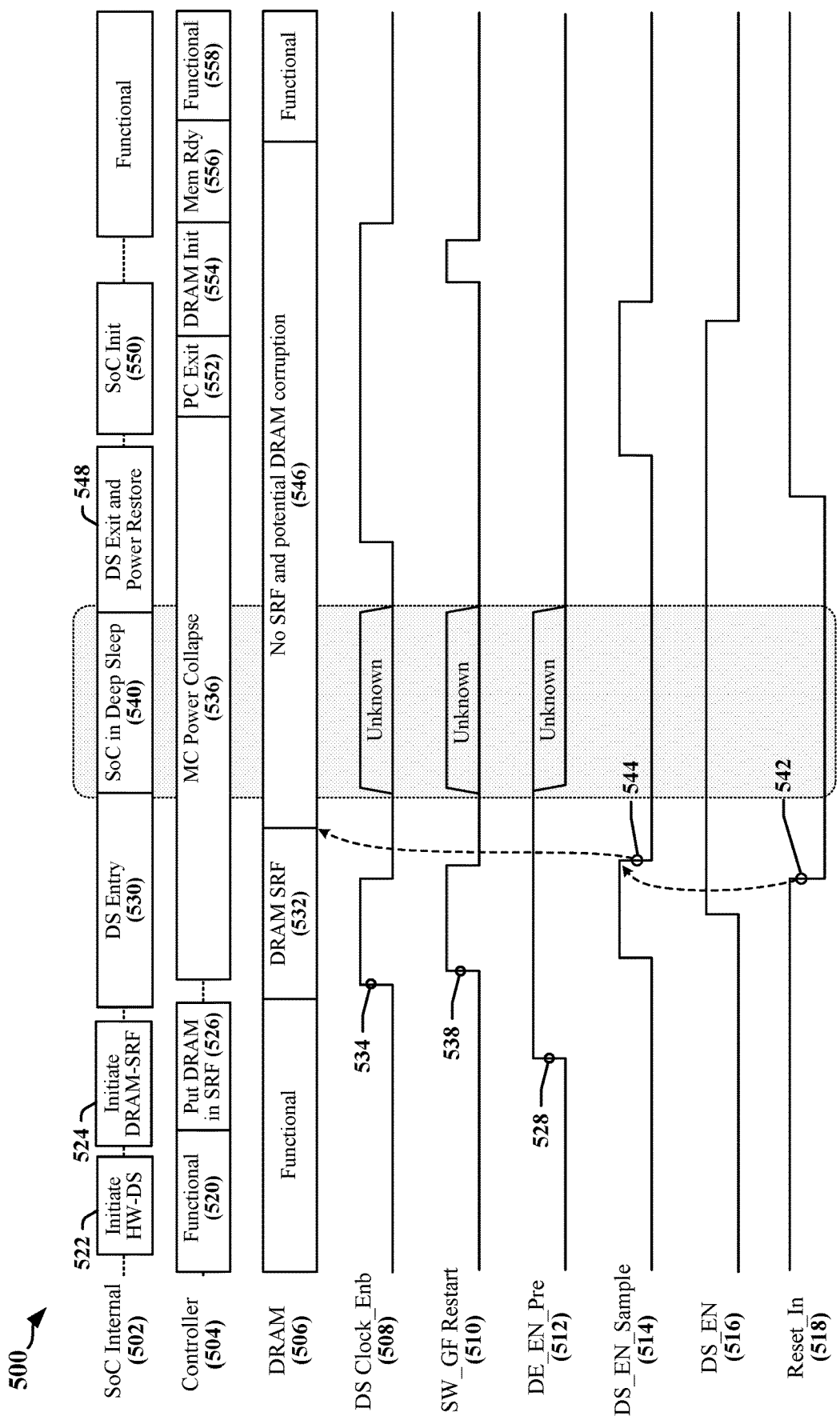
FIG. 5 illustrates the effect of glitches on a memory subsystem during a deep sleep mode.

FIG. 5 is a timing diagram 500 that illustrates the effect of glitches on a memory subsystem that is configured to perform self refresh of dynamic random access memory (DRAM) when a controlling SoC or other device in a conventional system enters a deep sleep mode. Operating state of the SoC is represented along the SoC Internal timeline 502, operating state of a memory controller in the memory subsystem is represented along the Controller timeline 504, and operating state of DRAM in the memory subsystem is represented along the DRAM timeline 506. The memory subsystem may include or support LPDDR SDRAM, for example. The timing diagram 500 depicts an example in which a sequence of events commences while the SoC and memory subsystem are fully operational.

In the illustrated example, the SoC enters a DS-Initiate state 522 in which the SoC initiates entry into hardware deep sleep. The SoC may enter an SRF-Initiate state 524 in which it signals or causes the memory subsystem to enter a low power mode. The memory subsystem responds by causing one or more memory controllers to transition from a fully functional state 520 to a state 526 in which SRF operation is initiated for DRAM. The SoC may enter a DS-Entry state 530 in which certain circuits and/or subsystems are disabled or powered off while other circuits and/or subsystems are powered down or caused to operate in a low-power consumption mode. In the DS-Entry state 530, the SoC may discontinue or suppress memory refresh control signals before entering a deep sleep state 540. Responsibility for memory refresh is transferred to the memory subsystem while the SoC is in the DS-Entry state 530. In the illustrated example, DRAM may transition from a fully functional state to a DRAM SRF state 532 in which the integrity of data stored in the DRAM is maintained through DRAM self refresh.

Current supply to certain power rails in the SoC may be terminated during the deep sleep state 540. In the illustrated example, the memory controllers may enter a power collapse state 536 and remain in the power collapse state 536 while the SoC is the deep sleep state 540. The memory controllers often have limited or no functionality in the power collapse state 536. In the power collapse state 536, power supplies to the memory controller may be suppressed or terminated or the memory controller may receive power at reduced voltage. The memory controller may disable some proportion of its internal circuits in the power collapse state 536, and the integrity of stored data in DRAM relies on DRAM SRF.

The SoC and a PMIC may generate certain signals that coordinate or control entry and exit from the deep sleep state. For example, the SoC may configure a register that causes a deep sleep preset signal (the DS_EN_pre signal 512) to be asserted at a point in time 528 during the SRF-Initiate state 524. The SoC may cause a deep sleep clock signal to be provided to support certain functions and circuits during the deep sleep state 540, including SRF and glitch filter circuits. In one example, the SoC asserts a deep sleep clock enable signal (the DS Clock Enb signal 508) at a point in time 534 during the SRF-Initiate state 524. The SoC may also assert a glitch filter restart signal (the SWF_GF Restart signal 510) at a point in time 538 during the SRF-Initiate state 524 in order to initialize or reset the glitch filter.

The glitch filter may correspond to the conventional glitch filtering circuit 400 illustrated in FIG. 4 and may receive a DS_EN signal 516 from a PMIC. The glitch filter may be preconfigured by the DS_EN_pre signal 512. The glitch filter provides a sampled or filtered output (the DS_EN_Sample signal 514) that follows the DS_EN signal 516 when the DS_EN signal 516 remains in a constant state for a threshold number of clock cycles. In the illustrated example, the DS_EN_Sample signal 514 follows the DS_EN signal 516 while ignoring glitches in the DS_EN signal 516. The PMIC may also provide a reset signal (the Reset_In signal 518) that is propagated throughout the SoC and that causes the SoC to perform a cold boot or fast boot, based on the state of the DS_EN_Sample signal 514. The SoC is configured to execute a quick-boot procedure instead of a cold boot procedure when the DS_EN_Sample signal 514 is asserted when the Reset_In signal 518.

The timing diagram 500 illustrates a potential effect of driving the Reset_In signal 518 low while the SoC is in the deep sleep state 540 or is entering the deep sleep state 540. The Reset_In signal 518 is propagated throughout the SoC and, in conventional systems, resets the glitch filter or the counters and other circuits in or associated with the glitch filter. A falling edge 542 on the Reset_In signal 518 causes de-assertion 544 of the DS_EN_Sample signal 514, falsely indicating to the SoC, memory controller and DRAM that the system is not awakening from deep sleep, but is expecting a cold boot. As a consequence, the DRAM may enter an indeterminate state 546 in which self refresh control settings become unknown and memory contents may be corrupted.

In the illustrated example, the PMIC continues to assert the DS_EN signal 516 until the SoC has restored normal operation in an initialization state (the SoC Init state 550). The SoC transitions to the SoC Init state 550 from deep sleep recovery state (the DS Exit state 548) and enters a normal functioning state 566 when initialization has been successfully completed. The SoC may perform a quick boot in the SoC Init state 550 when DS_EN_Sample signal 514 is asserted. The SoC may perform a cold boot in the SoC Init state 550 when DS_EN_Sample signal 514 is not asserted or when memory corruption is detected. As part of the quick boot process, the SoC may cause memory controllers to transition from the power collapse state 536 to a power collapse recovery state (the PC Exit state 552) and, from there, into a memory initialization state (the DRAM Init 554) where normal refresh operations are resumed. The memory controllers may then enter an idle or ready state (the Mem RDY state 556) until normal functions commences 558.

Certain aspects of this disclosure relate to glitch filtering circuits that can be used to maintain the signaling integrity of control signals and/or other signals during transitions between operating states. In many implementations, the stability of certain signals must be maintained through operating state transitions in order to maintain continuity of operational state of a system. For example, glitch filtering circuits disclosed herein may be configured to provide protection against glitches on deep sleep mode signals and/or reset signals. For the purposes of this disclosure, the example of a deep-sleep enable signal is used in order to describe certain concepts that are equally applicable to other types of signal. Glitch filtering circuits adapted or configured in accordance with this disclosure may be deployed externally of the circuits that generate or respond to signals protected by the glitch filtering circuits. In one example, signals generated by a memory controller may be protected by the glitch filtering circuits that are operated independently of the memory controller or located outside the memory controller or outside an IC device that includes the memory controller. In other examples, the glitch filtering circuits may be collocated with the circuits that generate or respond to signals protected by the glitch filtering circuits or within the circuits that generate or respond to signals protected by the glitch filtering circuits. In some memory controllers, for example, the glitch filtering circuits may be provided within an always-on segment or "safety island" within the memory controller or within an IC device that includes the memory controller.

Glitch filtering circuits implemented in accordance with certain aspects of this disclosure can avoid data corruption when an SoC is reset in deep sleep mode. In one aspect, certain circuits in the presently disclosed glitch filtering circuits are dissociated from SoC reset signals and can provide glitch-free deep sleep indications regardless of whether the SoC is subjected to a full reset when entering, maintaining or exiting deep sleep modes of operation.

Figure 6:
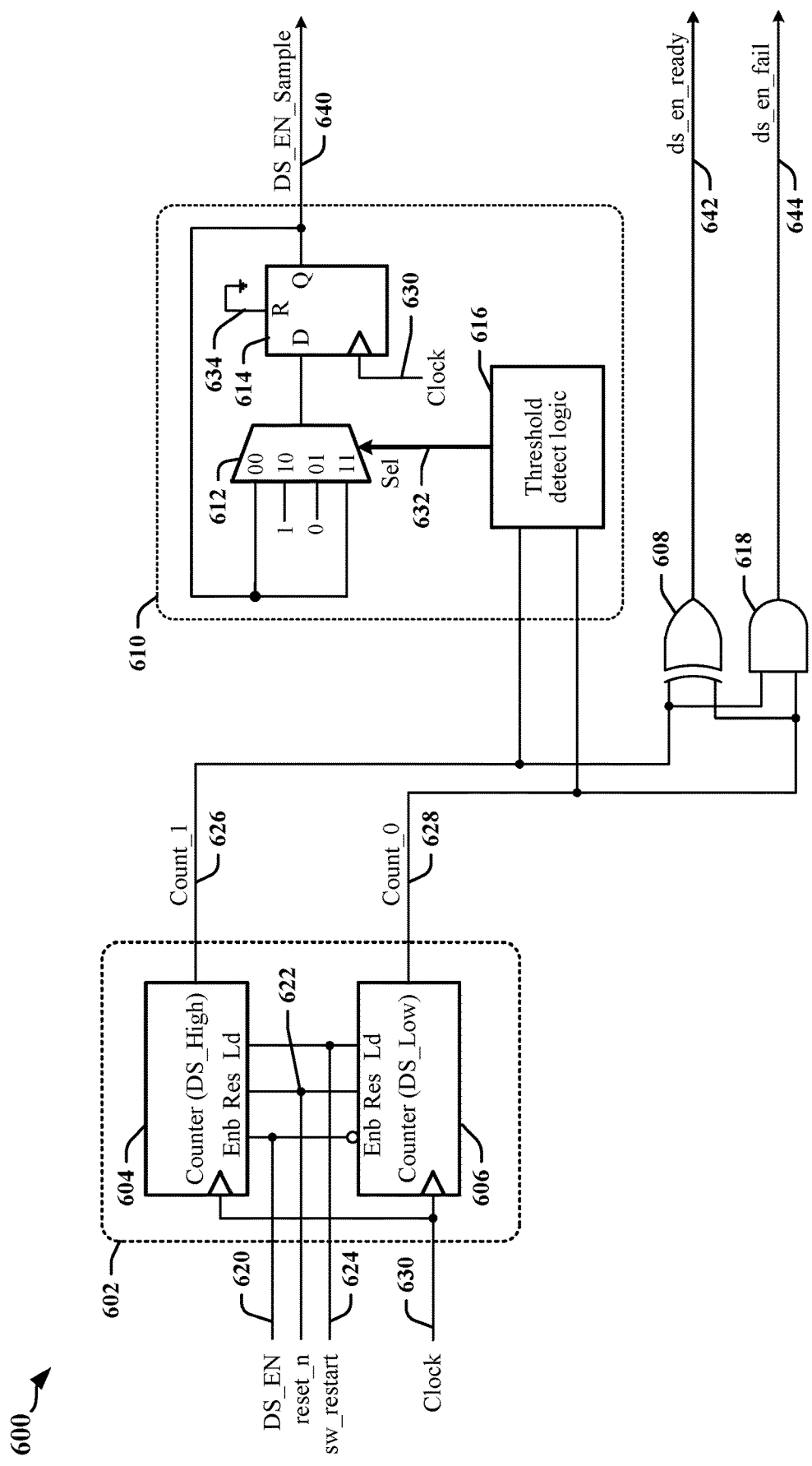
FIG. 6 illustrates a first example of a glitch filtering circuit provided in accordance with certain aspects of this disclosure.

FIG. 6 illustrates a first example of a glitch filtering circuit 600 implemented in an SoC in accordance with certain aspects of this disclosure. The glitch filtering circuit 600 includes a counting circuit 602 and sampling logic 610. In the illustrated example, the counting circuit 602 includes two counters 604, 606. In other implementations, the counting circuit 602 may include a different number of counters and/or different types of counters. Both counters in the illustrated counting circuit 602 are clocked by a clock signal 630 and enabled by a deep sleep enable signal (the DS_EN signal 620). One counter (DS_High counter 604) is enabled when the DS_EN signal 620 is in a high signaling state and the other counter (DS_Low counter 606) is enabled when the DS_EN signal 620 is in a low signaling state. The DS_EN signal 620 may be received from a PMIC. In the illustrated example, the DS_High counter 604 counts up when the DS_EN signal 620 is asserted and the DS_Low counter 606 counts up when the DS_EN signal 620 is not asserted. The counters 604, 606 count cycles of the clock signal 630, which may be provided by the SoC or generated internally. The count value of an enabled counter 604 or 606 increases for every clock cycle or at edges of the clock signal 630. The period of the clock signal 630 may be selected to limit the effect of a glitch. The counters 604, 606 may further receive the SoC hard reset signal (reset_n 622) and/or to a restart signal (sw_restart 624) that is generated by the action of software.

The outputs 626, 628 of the counters 604, 606 may be provided to threshold detect logic 616. The outputs 626, 628 of the counters 604, 606 may include the entire count value of the respective counter 604, 606 or may indicate that a certain count value has been reached. A counter 604, 606 may be configured to count up until a threshold value is reached. In some implementations, a change in single bit in the output 626, 628 of a counter 604, 606 may indicate that the threshold value has been reached. In one example, a counter 604, 606 may be configured to count up until its most significant bit (MSB) is set. In another example, a counter 604, 606 may be configured to continue counting until a selected output bit, an overflow bit is set. In some implementations, a counter 604, 606 may be halted when it reaches the threshold value. In some implementations, both counters 604, 606 may be cleared when reset_n 622 is asserted. In some implementations, a counter 604, 606 may be cleared or set to a configured value when sw_restart 624 is asserted.

In the illustrated example, the output (the DS_EN_Sample signal 640) of the glitch filtering circuit 600 is provided by the sampling logic 610. The DS_EN_Sample signal 640 is derived from the output of a flipflop 614, a latch, register or the like. A clock input of the flipflop 614 may be driven by the clock signal 630 or a phase shifted version of the clock signal 630. The flipflop 614 is configured to capture the state of an output of a multiplexer 612 that selects the next state of the DS_EN_Sample signal 640 based on the outputs 626, 628 of the counters 604, 606.

The threshold detect logic 616 may include one-bit or multi-bit digital comparators and other combinational logic. In some implementations, the threshold detect logic 616 compares the output 626, 628 of each counters 604, 606 with a corresponding threshold value to determine the state of the DS_EN signal 620. For example, the DS_EN signal 620 may be determined to be in a high signaling state when the output of the DS_High counter 604 has reached a first threshold count value, and the DS_EN signal 620 may be determined to be in a low signaling state when the output of the DS_Low counter 606 has reached a second threshold count value. In some implementations, the first threshold count value is the same as the second threshold count value. In some implementations, the output 626 of the DS_High counter 604 is determined to have reached or exceeded the first threshold count value when the MSB or another bit of the DS_High counter 604 is in a high signaling state, and the output 628 of the DS_Low counter 606 is determined to have reached or exceeded the second threshold count value when the MSB or another bit of the DS_Low counter 606 is in a high signaling state.

An output 632 of the threshold detect logic 616 is provided to a select input of the multiplexer 612. In the illustrated example, the output 632 of the threshold detect logic 616 includes two bits that select the current output of the flipflop 614 to provide the input to the flipflop 614 when the two bits have the same value. The two bits have the same value when neither of the counters 604, 606 has reached a threshold count value or when both of the counters 604, 606 have reached the threshold count value. The two bits have the same zero value after the counters 604, 606 have been reset, for example. The two bits have the same non-zero value after both counters 604, 606 have reached the threshold count value, representing an error state. In one example, the multiplexer 612 selects a non-zero value as the input to the flipflop 614 when the output 626 of the DS_High counter 604 is in a high signaling state and selects a zero value as the input to the flipflop 614 when the output 626 of the DS_Low counter 606 is in a high signaling state. In another example, the multiplexer 612 selects a non-zero value as the input to the flipflop 614 when the output 626 of the DS_High counter 604 has reached its corresponding threshold count value and selects a zero value as the input to the flipflop 614 when the output 626 of the DS_Low counter 606 has reached its corresponding threshold count value.

A reset input 634 of the flipflop 614 may be disabled when the glitch filtering circuit 600 is filtering glitches from the DS_EN signal 620. In some implementations, the reset input 634 of the flipflop 614 is permanently disabled. In some implementations, the flipflop 614 is non-resettable. In the illustrated implementation, the flipflop 614 has a reset input 634 that is pulled to a low signaling state in order to disable the reset function. The flipflop 614 is not affected by the state of reset_n 622 or the state of sw_restart 624. The counters 604, 606 may be reset or reloaded when reset_n 622 or sw_restart 624 is asserted. When the counters 604, 606 are reset or reloaded, the threshold detect logic 616 selects the current output of the flipflop 614 to provide the input to the flipflop 614 until one of the counters 604, 606 reaches a threshold value and provides a reliable indication of the state of the DS_EN signal 620. The size of the counters 604, 606 (which may be represented as the number of bits in the outputs 626, 628), the number or position of bits compared by the threshold detect logic 616 and/or the frequency of the clock signal 630 may be configured or selected to suppress glitches in the DS_EN signal 620 or in circuits in the SoC used to propagate the DS_EN signal 620.

The DS_EN_Sample signal 640 output by the sampling logic 610 may be configured to provide a filtered or sampled version of the DS_EN signal 620 in which the effects of glitches in the DS_EN signal 620 is limited. For example, the effects of glitches may be limited to an increased delay before a change in the DS_EN signal 620 is propagated to the DS_EN_Sample signal 640.

The glitch filtering circuit 600 may include logic circuits that provide state information. In the illustrated example, the state information is represented by a first signal (the ds_en_ready signal 642) and a second signal (the ds_en_fail signal 644). The ds_en_ready signal 642 is asserted when the DS_EN signal 620 is in a valid or known state. The valid or known state may be indicated when either the output 626 of the DS_High counter 604 or the output 626 of the DS_Low counter 606 has reached its corresponding threshold value. The ds_en_ready signal 642 is asserted when an error condition is detected, including when both the output 626 of the DS_High counter 604 and the output 626 of the DS_Low counter 606 have reached their corresponding threshold values. In the illustrated example, the threshold values are reached when an MSB or another bit in the output 626 of the DS_High counter 604 and/or the output 626 of the DS_Low counter 606 are set, and simple logic gates 608, 618 can be used to generate the state information.

The ds_en_fail signal 644 signal may be asserted when the DS_High counter 604 and the DS_Low counter 606 have both reached their respective thresholds. The ds_en_fail signal 644 signal indicates catastrophic fault in the system, since the DS_High counter 604 and the DS_Low counter 606 should not reach their respective thresholds during normal operation.

Figure 7:
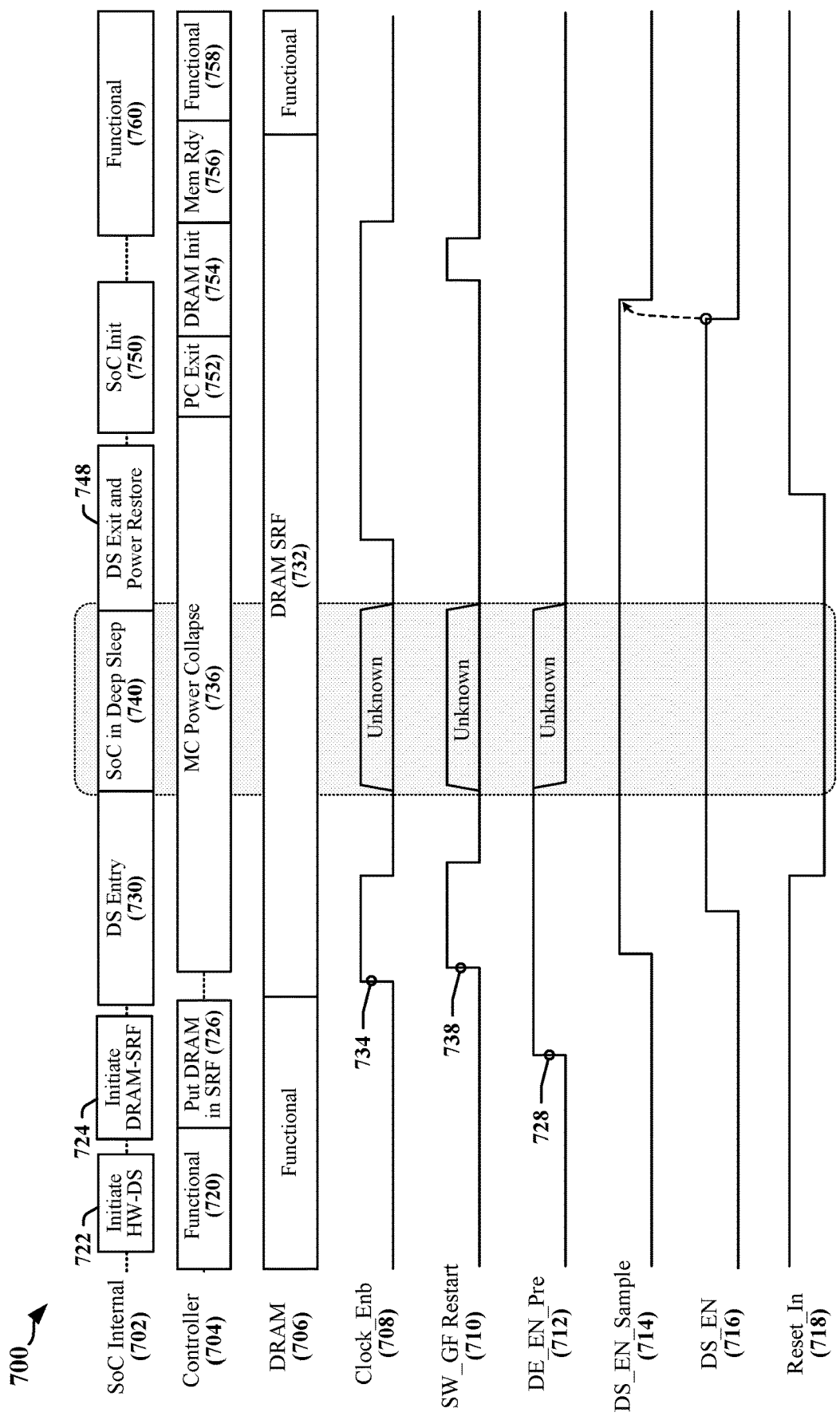
FIG. 7 is a timing diagram that illustrates the effect of glitches on a memory subsystem that is protected by the glitch filtering circuit illustrated in FIG. 6.

FIG. 7 is a timing diagram 700 that illustrates the effect of glitches on a memory subsystem that is protected by the glitch filtering circuit 600 illustrated in FIG. 6. The timing diagram 700 is based on the sequence of events illustrated in the timing diagram 500 illustrated in FIG. 5. The memory subsystem is configured to perform self-refresh of DRAM when a controlling SoC or other device enters a deep sleep mode. Operating state of the SoC is represented along the SoC Internal timeline 702, operating state of a memory controller in the memory subsystem is represented along the Controller timeline 704, and operating state of DRAM in the memory subsystem is represented along the DRAM timeline 706. The memory subsystem may include or support LPDDR SDRAM, for example. The timing diagram 700 depicts an example in which a sequence of events commences while the SoC and memory subsystem are fully operational.

In the illustrated example, the SoCenters a DS-Initiate state 722 in which the SoC initiates entry into hardware deep sleep. The SoC may enter an SRF-Initiate state 724 in which it signals or causes the memory subsystem to enter a low power mode. The memory subsystem responds by causing one or more memory controllers to transition from a fully functional state 720 to a state 726 in which SRF operation is initiated for DRAM. The SoC may enter a DS-Entry state 730 in which certain circuits and/or subsystems are disabled or powered off while other circuits and/or subsystems are powered down or caused to operate in a low-power consumption mode. In the DS-Entry state 730, the SoC may discontinue or suppress memory refresh control signals before entering a deep sleep state 740. Responsibility for memory refresh is transferred to the memory subsystem while the SoC is in the DS-Entry state 730. In the illustrated example, DRAM may transition from a fully functional state to a DRAM SRF state 732 in which the integrity of data stored in the DRAM is maintained through DRAM self refresh.

Current supply to certain power rails in the SoC may be terminated during the deep sleep state 740. In the illustrated example, the memory controllers may enter a power collapse state 736 and remain in the power collapse state 736 while the SoC is the deep sleep state 740. The memory controllers have limited or no functionality in the power collapse state 736. In the power collapse state 736, power supplies to the memory controller may be suppressed or terminated or the memory controller may receive power at reduced voltage. The memory controller may disable some proportion of its internal circuits in the power collapse state 736, and the integrity of stored data in DRAM relies on DRAM SRF.

The SoC and a PMIC may generate certain signals that coordinate or control entry and exit from the deep sleep state. For example, the SoC may configure a register that causes a deep sleep preset signal (the DS_EN_pre signal 712) to be asserted at a point in time 728 during the SRF-Initiate state 724. The SoC may cause a deep sleep clock signal to be provided to support certain functions and circuits during the deep sleep state 740, including SRF and glitch filter circuits. In one example, the SoC asserts a deep sleep clock enable signal (the DS Clock Enb signal 708) at a point in time 734 during the SRF-Initiate state 724. The SoC may also assert a glitch filter restart signal (the SWF_GF Restart signal 710) at a point in time 738 during the SRF-Initiate state 724 in order to initialize or reset the glitch filter.

The glitch filter may be configured in accordance with certain aspects of this disclosure and may correspond to the glitch filtering circuit 600 illustrated in FIG. 6. The glitch filter may receive a DS_EN signal 716 from a PMIC. One or more counters in the glitch filter may be cleared or preconfigured after assertion of the DS_EN_pre signal 712. The glitch filter provides a sampled or filtered output (the DS_EN_Sample signal 714) that follows the DS_EN signal 716 when the DS_EN signal 716 remains in a constant state for a threshold number of clock cycles. In the illustrated example, the DS_EN_Sample signal 714 follows the DS_EN signal 716 while ignoring glitches in the DS_EN signal 716. The PMIC may also provide a reset signal (the Reset_In signal 718) that is propagated throughout the SoC and that causes the SoC to perform a cold boot or fast boot, based on the state of the DS_EN_Sample signal 714. The SoC is configured to execute a quick-boot procedure instead of a cold boot procedure when the DS_EN_Sample signal 714 is asserted when the Reset_In signal 718.

In the illustrated timing diagram 700 illustrates the Reset_In signal 718 is driven low while the SoC is in the deep sleep state 740 or is entering the deep sleep state 740. The Reset_In signal 718 is propagated throughout the SoC but has no effect on the signaling state of the DS_EN_Sample signal 714. Accordingly, the DS_EN_Sample signal 714 continues to indicate to the SoC, memory controller and DRAM that the system is awakening from deep sleep. The DRAM remains in the DRAM SRF state 736.

In the illustrated example, the PMIC continues to assert the DS_EN signal 716 until the SoC has restored normal operation in an initialization state (the SoC Init state 750). The SoC transitions to the SoC Init state 750 from deep sleep recovery state (the DS Exit state 748) and enters a normal functioning state 760 when initialization has been successfully completed. The SoC may perform a quick boot in the SoC Init state 750 when DS_EN_Sample signal 714 is asserted. The SoC may perform a cold boot in the SoC Init state 750 when DS_EN_Sample signal 714 is not asserted or when memory corruption is detected. As part of the quick boot process, the SoC may cause memory controllers to transition from the power collapse state 736 to a power collapse recovery state (the PC Exit state 752) and, from there, into a memory initialization state (the DRAM Init 754) where normal refresh operations are resumed. The memory controllers may then enter an idle or ready state (the Mem RDY state 756) until normal functions commences 758.

Figure 8:
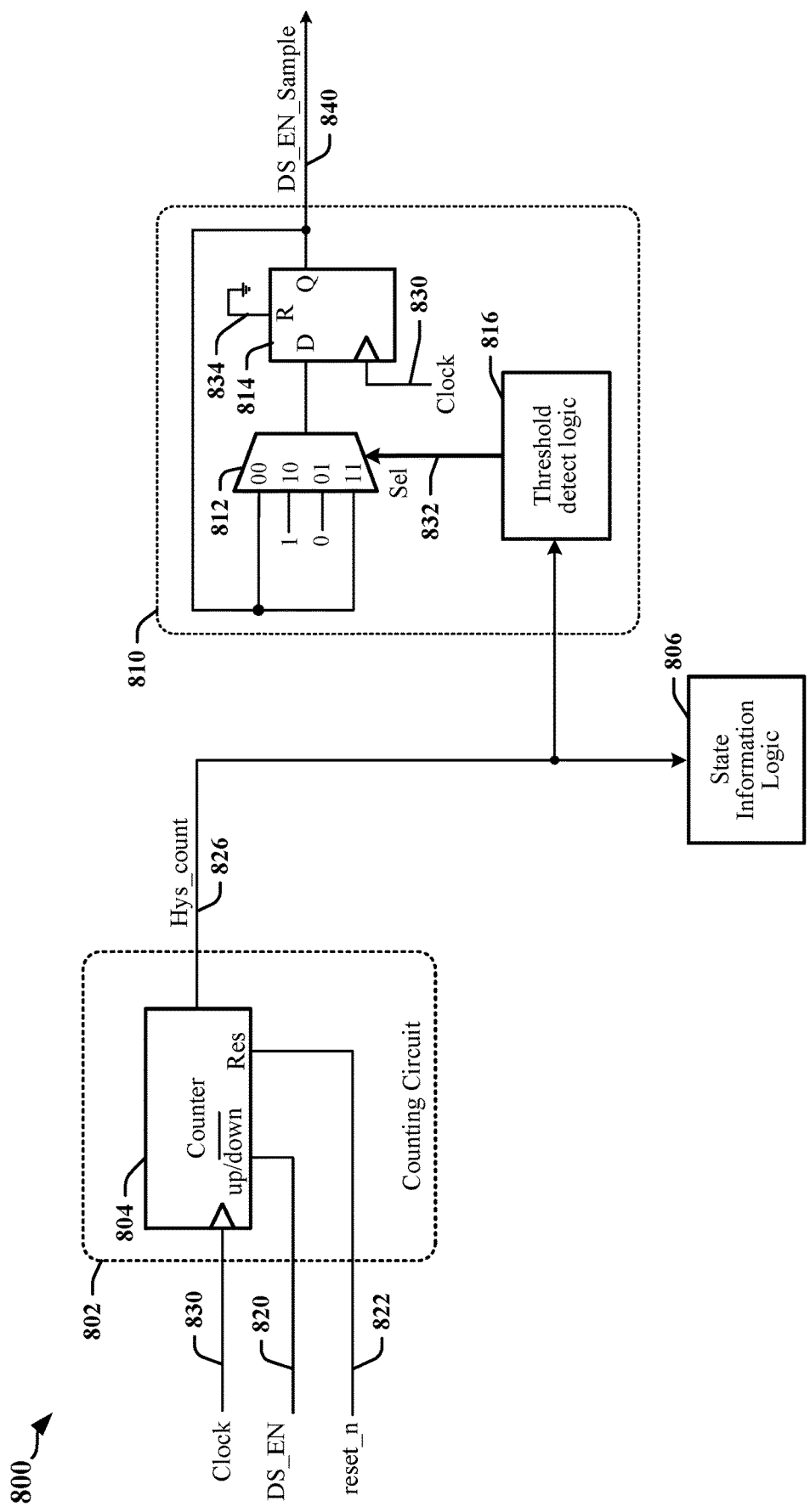
FIG. 8 illustrates a second example of a glitch filtering circuit provided in accordance with certain aspects of this disclosure.

FIG. 8 illustrates a second example of a glitch filtering circuit 800 provided in accordance with certain aspects of this disclosure. The glitch filtering circuit 800 may be implemented in an SoC or a memory controller.

The glitch filtering circuit 800 includes a counting circuit 802 and sampling logic 810. In the illustrated example, the counting circuit 802 includes a counter 804 configured for selectively counting up or counting down. In other implementations, the counting circuit 802 may include a different number of counters and/or different types of counters. The counter 804 may be implemented may be referred to as a hysteresis counter. The DS_EN signal 820 received from a PMIC controls the direction of count of the counter 804. In the illustrated example, the counter 804 counts up when the DS_EN signal 820 is asserted and counts down when the DS_EN signal 820 is not asserted. The counter 804 counts cycles of a clock signal 830 provided by the SoC. The count value of the counter 804 increases for every clock cycle or at edges of the clock signal 830 while the DS_EN signal 820 is asserted. The count value of the counter 804 decreases for every clock cycle or at edges of the clock signal 830 while the DS_EN signal 820 is not asserted. Glitches in the DS_EN signal 820 may be missed if they are sufficiently short and may otherwise cause the counter to change direction while the glitch affects the DS_EN signal 820. The period of the clock signal 830 may be selected to control the glitch filtering window. Slowing the clock signal 830 increases the glitch filtering window. The counter 804 may be coupled to an SoC hard reset signal 822.

The output 826 of the counter 804 may be provided to threshold detect logic 816. The output 826 of the counter 804 may include the entire count value of the counter 804 or may indicate that a certain count value has been reached. In various implementations, the output 826 of the counter 804 include a most significant bit (MSB), another bit or an overflow or underflow bit. For example, the counter 804 may be configured to count up until the MSB is set or count down until the signal indicating zero value is set. In some implementations, the counter 804 may be halted when it reaches a corresponding threshold value. In some implementations, the counter 804 may be cleared when the SoC hard reset signal 822 is asserted.

In the illustrated example, the output (the DS_EN_Sample signal 840) of the glitch filtering circuit 800 is provided by the sampling logic 810. The DS_EN_Sample signal 840 is derived from the output of a flipflop 814, a latch, register or the like. A clock input of the flipflop 814 is driven by the clock signal 830 or a phase shifted version of the clock signal 830. The flipflop 814 is configured to capture the state of an output of a multiplexer 812 that selects the next state of the DS_EN_Sample signal 840 based on the output 826 of the counter 804.

In the some implementations, the threshold detect logic 816 compares the output 826 of the counter 804 with a corresponding threshold value to determine the state of the DS_EN signal 820. For example, the DS_EN signal 820 may be determined to be in a high signaling state when the output of the counter 804 has reached a first threshold count value, and the DS_EN signal 820 may be determined to be in a low signaling state when the output of the counter 804 has reached a second threshold count value. In some implementations, the output 826 of the counter 804 is determined to have exceeded the first threshold count value when the MSB or another bit of the counter 804 is in a high signaling state, and the output 826 of the counter 804 is determined to have exceeded the second threshold count value when the counter 804 reaches zero or the count value falls below a configured value.

An output 832 of the threshold detect logic 816 is provided to a select input of the multiplexer 812. In the illustrated example, the output 832 of the threshold detect logic 816 includes two bits that select the current output of the flipflop 814 to provide the input to the flipflop 814 when the two bits have the same value. The two bits have the same value when the counter 804 has not reached either threshold count value, after the counter 804 has been reset, for example. The two bits may have the same non-zero value to represent an error state. The multiplexer selects a non-zero value as the input to the flipflop 814 when the output 826 of the counter 804 has reached the first threshold count value, and selects a zero value as the input to the flipflop 814 when the output 826 of the counter 804 has reached the second threshold count value.

A reset input 834 of the flipflop 814 may be disabled when the glitch filtering circuit 800 is filtering glitches from the DS_EN signal 820. In some implementations, the reset input 834 of the flipflop 814 is permanently disabled. In some implementations, the flipflop 814 is non-resettable. In the illustrated implementation, the flipflop 814 has a reset input 834 that is pulled to a low signaling state in order to disable the reset function. The flipflop 814 is not affected by state of the SoC hard reset signal 822. The counter 804 may be reset when the SoC hard reset signal 822 is asserted. When the counter 804 is reset, the threshold detect logic 816 selects the current output of the flipflop 814 to provide the input to the flipflop 814 until the counter 804 reaches one of the threshold values and provides a reliable indication of the state of the DS_EN signal 820. The size of the counter 804 (which may be represented as the number of bits in the output 826), the number or position of bits compared by the threshold detect logic 816 and/or the frequency of the clock signal 830 may be configured or selected to suppress glitches in the DS_EN signal 820 or in circuits in the SoC used to propagate the DS_EN signal 820.

The DS_EN_Sample signal 840 output by the sampling logic 810 may be configured to provide a filtered or sampled version of the DS_EN signal 820 in which the effects of glitches in the DS_EN signal 820 is limited. For example, the effects of glitches may be limited to an increased delay before a change in the DS_EN signal 820 is propagated to the DS_EN_Sample signal 840.

The glitch filtering circuit 800 may include logic circuits 806 that provide state information. For example, logic circuits 806 may include digital comparators or other combinational logic that are configured to monitor the output 826 of the counter 804 and/or the threshold detect logic 816 to determine the state information The state information may indicate when the DS_EN signal 820 is in a valid or known state and/or when an error condition is detected in the glitch filtering circuit 800.

Examples of Processing Circuits and Methods

Figure 9:
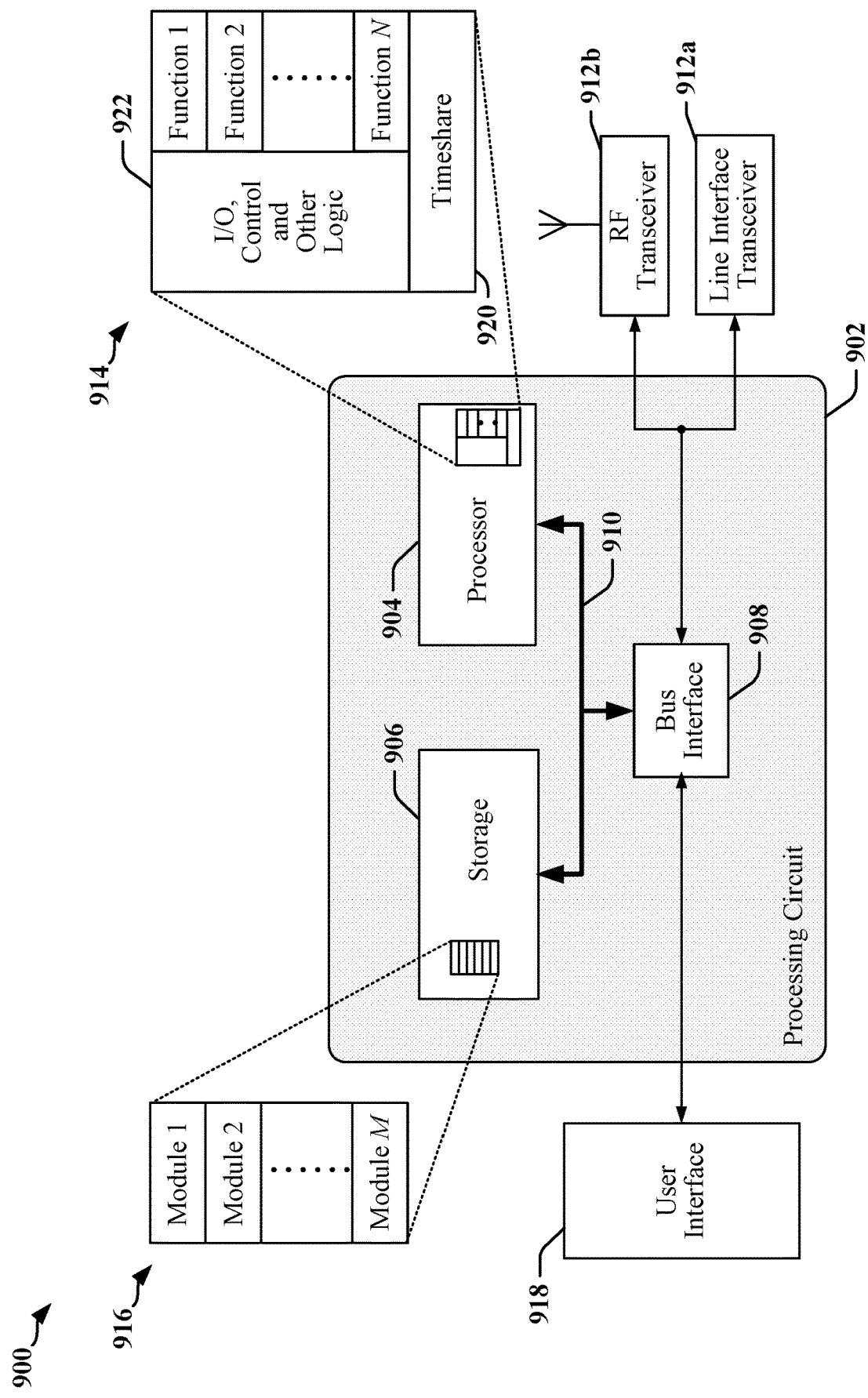
FIG. 9 illustrates one example of an apparatus employing a processing circuit that may be adapted according to certain aspects disclosed herein.

FIG. 9 is a diagram illustrating an example of a hardware implementation for an apparatus 900 employing a processing circuit 902. The processing circuit 902 may include or configure the operation of a finite state machine. In some examples, the apparatus 900 may perform one or more functions disclosed herein. In accordance with various aspects of the disclosure, an element, or any portion of an element, or any combination of elements as disclosed herein may be implemented using a processing circuit 902. The processing circuit 902 may include one or more processors 904 that are controlled by some combination of hardware and software modules. Examples of processors 904 include microprocessors, microcontrollers, digital signal processors (DSPs), SoCs, ASICs, field programmable gate arrays (FPGAs), programmable logic devices (PLDs), state machines, sequencers, gated logic, discrete hardware circuits, and other suitable hardware configured to perform the various functionality described throughout this disclosure. The one or more processors 904 may include specialized processors that perform specific functions, and that may be configured, augmented or controlled by one of the software modules 916. The one or more processors 904 may be configured through a combination of software modules 916 loaded during initialization, and further configured by loading or unloading one or more software modules 916 during operation.

In the illustrated example, the processing circuit 902 may be implemented with a bus architecture, represented generally by the bus 910. The bus 910 may include any number of interconnecting buses and bridges depending on the specific application of the processing circuit 902 and the overall design constraints. The bus 910 links together various circuits including the one or more processors 904, and storage 906. Storage 906 may include memory devices and mass storage devices and may be referred to herein as computer-readable media and/or processor-readable media.

In some examples, the storage 906 includes registers used to communicate virtual GPIO information. One set of registers may be configured to maintain address, management and payload information corresponding to a physical GPIO and one or more devices to which virtual GPIO information is transmitted. Another set of registers may maintain information in a format corresponding to the one or more devices to which the virtual GPIO information is transmitted.

The bus 910 may also link various other circuits such as timing sources, timers, peripherals, voltage regulators, and power management circuits. A bus interface 908 may provide an interface between the bus 910 and one or more transceivers 912a, 912b. A transceiver 912a, 912b may be provided for each networking technology supported by the processing circuit. In some instances, multiple networking technologies may share some or all of the circuitry or processing modules found in a transceiver 912a, 912b. Each transceiver 912a, 912b provides a means for communicating with various other apparatus over a transmission medium. In one example, a transceiver 912a may be used to couple the apparatus 900 to a multi-wire bus. In another example, a transceiver 912b may be used to connect the apparatus 900 to a radio access network. Depending upon the nature of the apparatus 900, a user interface 918 (e.g., keypad, display, speaker, microphone, joystick) may also be provided, and may be communicatively coupled to the bus 910 directly or through the bus interface 908.

A processor 904 may be responsible for managing the bus 910 and for general processing that may include the execution of software stored in a computer-readable medium that may include the storage 906. In this respect, the processing circuit 902, including the processor 904, may be used to implement any of the methods, functions and techniques disclosed herein. The storage 906 may be used for storing data that is manipulated by the processor 904 when executing software, and the software may be configured to implement any one of the methods disclosed herein.

One or more processors 904 in the processing circuit 902 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 906 or in an external computer-readable medium. The external computer-readable medium and/or storage 906 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, ROM, a programmable read-only memory (PROM), an erasable PROM (EPROM) including EEPROM, a register, a removable disk, and any other suitable medium for storing software and/or instructions that may be accessed and read by a computer. The computer-readable medium and/or storage 906 may also include, by way of example, a carrier wave, a transmission line, and any other suitable medium for transmitting software and/or instructions that may be accessed and read by a computer. Computer-readable medium and/or the storage 906 may reside in the processing circuit 902, in the processor 904, external to the processing circuit 902, or be distributed across multiple entities including the processing circuit 902. The computer-readable medium and/or storage 906 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 906 may maintain software maintained and/or organized in loadable code segments, modules, applications, programs, etc., which may be referred to herein as software modules 916. Each of the software modules 916 may include instructions and data that, when installed or loaded on the processing circuit 902 and executed by the one or more processors 904, contribute to a run-time image 914 that controls the operation of the one or more processors 904. When executed, certain instructions may cause the processing circuit 902 to perform functions in accordance with certain methods, algorithms and processes described herein.

Some of the software modules 916 may be loaded during initialization of the processing circuit 902, and these software modules 916 may configure the processing circuit 902 to enable performance of the various functions disclosed herein. For example, some software modules 916 may configure internal devices and/or logic circuits 922 of the processor 904, and may manage access to external devices such as the transceiver 912a, 912b, the bus interface 908, the user interface 918, timers, mathematical coprocessors, and so on. The software modules 916 may include a control program and/or an operating system that interacts with interrupt handlers and device drivers, and that controls access to various resources provided by the processing circuit 902. The resources may include memory, processing time, access to the transceiver 912a, 912b, the user interface 918, and so on.

One or more processors 904 of the processing circuit 902 may be multifunctional, whereby some of the software modules 916 are loaded and configured to perform different functions or different instances of the same function. The one or more processors 904 may additionally be adapted to manage background tasks initiated in response to inputs from the user interface 918, the transceiver 912a, 912b, and device drivers, for example. To support the performance of multiple functions, the one or more processors 904 may be configured to provide a multitasking environment, whereby each of a plurality of functions is implemented as a set of tasks serviced by the one or more processors 904 as needed or desired. In one example, the multitasking environment may be implemented using a timesharing program 920 that passes control of a processor 904 between different tasks, whereby each task returns control of the one or more processors 904 to the timesharing program 920 upon completion of any outstanding operations and/or in response to an input such as an interrupt. When a task has control of the one or more processors 904, the processing circuit is effectively specialized for the purposes addressed by the function associated with the controlling task. The timesharing program 920 may include an operating system, a main loop that transfers control on a round-robin basis, a function that allocates control of the one or more processors 904 in accordance with a prioritization of the functions, and/or an interrupt driven main loop that responds to external events by providing control of the one or more processors 904 to a handling function.

The apparatus 900 may include a glitch filtering circuit that includes a counting circuit configured to provide one or more counter output signals indicating whether an input signal has remained in a first signaling state or in a second signaling state for a preconfigured duration of time, a flipflop clocked by a clock signal and configured to provide an output of the glitch filtering circuit, a threshold detect circuit configured to generate a select signal based on the one or more counter output signals, and a multiplexer configured to provide a multiplexed signal to an input of the flipflop, the multiplexed signal having a signaling state that is selected in accordance with the select signal. In one example, the multiplexed signal has a signaling state that is selected in accordance with the select signal from an input fixed at the first signaling state, an input fixed at the second signaling state and an input that is coupled to the output of the glitch filtering circuit. A reset input of the flipflop may be disabled when filtering glitches from the input signal. In some implementations, the reset input of the flipflop is permanently disabled. In some implementations, the flipflop is non-resettable.

The counting circuit may include a first counter configured to count cycles of the clock signal when the input signal is in the first signaling state, and a second counter configured to count cycles of the clock signal when the input signal is in the second signaling state. The one or more counter output signals may include a first multibit signal indicative of an output of the first counter, and a second multibit signal indicative of an output of the second counter. The threshold detect circuit may be configured to generate the select signal by comparing the first multibit signal with a first threshold duration and the second multibit signal with a second threshold duration. The one or more counter output signals may include a first signal that is asserted when the input signal is in the first signaling state for a first threshold duration, and a second signal that is asserted when the input signal is in the second signaling state for a second threshold duration. The threshold detect circuit may be configured to generate the select signal based on a signaling state of the first signal and a signaling state of the second signal.

The counting circuit may include a counter configured to count up when the input signal is in the first signaling state and to count down when the input signal is in the second signaling state. The one or more counter output signals may include a multibit signal indicative of a count value of the counter. The threshold detect circuit may be configured to generate the select signal by comparing the multibit signal with a threshold duration. The one or more counter output signals may include a first signal that is asserted when the input signal is in the first signaling state for a first threshold duration, and a second signal that is asserted when the input signal is in the second signaling state for a second threshold duration. The threshold detect circuit may be configured to generate the select signal based on a signaling state of the first signal and a signaling state of the second signal.

The glitch filtering circuit may include a logic circuit is configured to provide state information related to operation of the glitch filtering circuit. The state information may include information indicating that the output of the glitch filtering circuit is a stable representation of the signaling state of the input signal.

Figure 10:
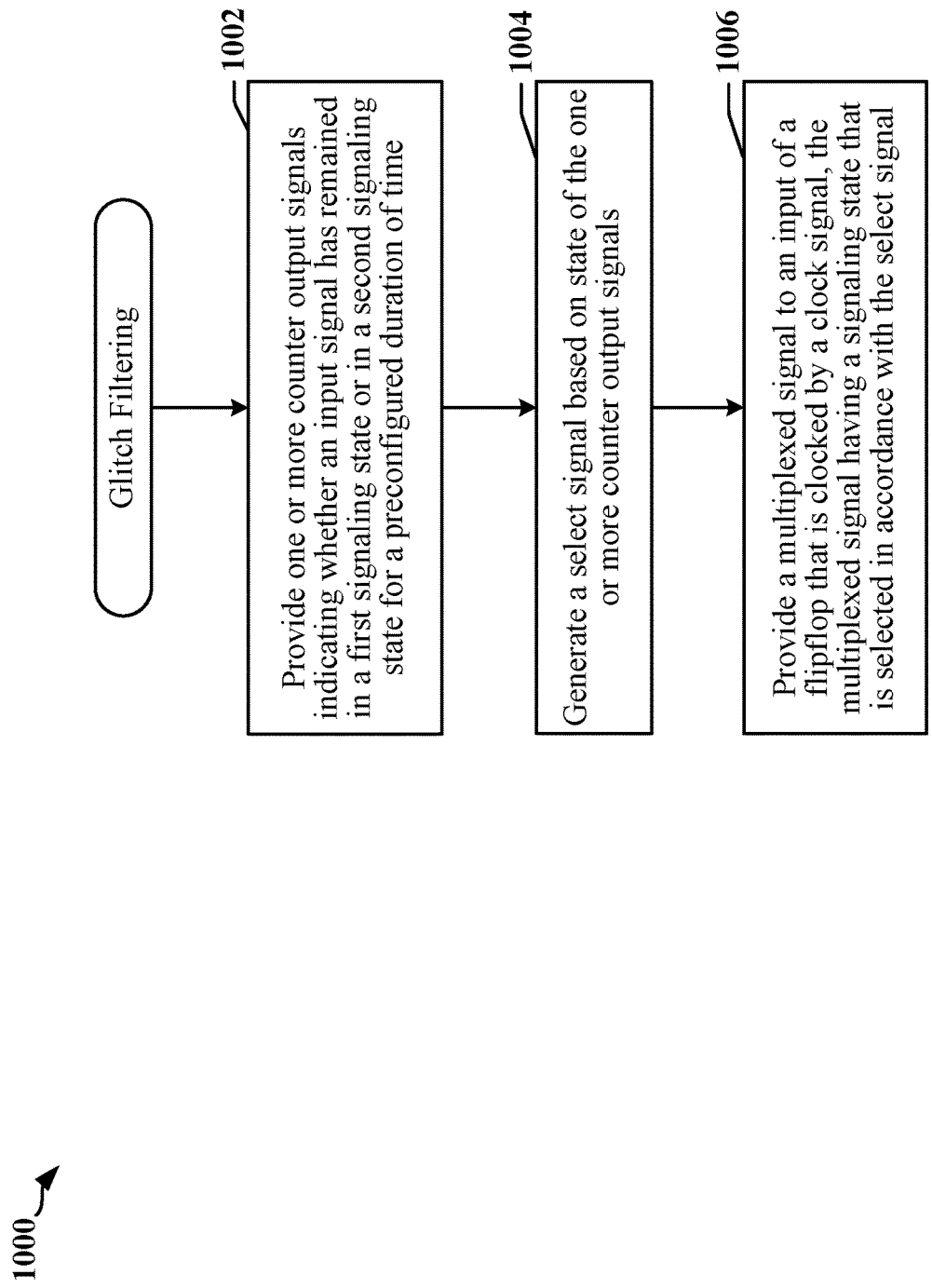
FIG. 10 is a third flowchart illustrating certain operations of device adapted in accordance with certain aspects disclosed herein.

FIG. 10 is a flowchart 1000 of a method for filtering glitches from an input signal. The method may be performed using a glitch filter. The glitch filter may be provided in a memory controller, an SoC and/or other integrated circuits in an apparatus.

At block 1002, one or more counter output signals are provided. The counter output signals may indicate whether an input signal has remained in a first signaling state or in a second signaling state for a threshold duration. The threshold duration may be based on a number of cycles of a clock signal. At block 1004, a select signal may be generated based on state of the one or more counter output signals. At block 1006, a multiplexed signal may be provided to an input of a flipflop. The flipflop may be clocked by a clock signal. The multiplexed signal may have a signaling state that is selected in accordance with the select signal. The signaling state may be selected from an input fixed at the first signaling state, an input fixed at the second signaling state and an input that is coupled to an output of the flipflop. A reset input of the flipflop may be disabled when filtering glitches from the input signal. In some implementations, the reset input of the flipflop is permanently disabled. In some implementations, the flipflop is non-resettable.

In certain implementations, a first count value may be provided by counting cycles of the clock signal when the input signal is in the first signaling state, and a second count value may be provided by counting cycles of the clock signal when the input signal is in the second signaling state. The select signal may be generated based on comparisons of the first count value and the second count value with the threshold duration. The select signal may be generated using a first signal indicating that the first count value matches the threshold duration, and to a second signal indicating that the second count value matches the threshold duration.

In certain implementations, an up/down counter may be incremented when the input signal is in the first signaling state and decremented the counter when the input signal is in the second signaling state. The select signal may be generated by comparing a multibit signal indicative of a count value of the counter with the threshold duration. The select signal may be generated by comparing a first signal with a second signal. The first signal may be asserted when the input signal is in the first signaling state for a first threshold duration and the second signal is asserted when the input signal is in the second signaling state for a second threshold duration.

In certain implementations, at least one signal representative of state information related to filtering glitches from the input signal may be generated. the state information may include information indicating that an output of the flipflop is a stable representation of the signaling state of the input signal.

In one example of an implementation, the method may be performed in a system that includes a primary SoC or other IC, a PMIC and a memory subsystem. The SoC may include circuits or modules configured to provide one or more counter output signals indicating whether an input signal has remained in a first signaling state or in a second signaling state for a preconfigured duration of time, circuits or modules configured to generate a select signal based on state of the one or more counter output signals, and circuits or modules configured to provide a multiplexed signal to an input of a flipflop that is clocked by a clock signal, the multiplexed signal having a signaling state that is selected in accordance with the select signal. In one example, the multiplexed signal has a signaling state that is selected in accordance with the select signal from an input fixed at the first signaling state, an input fixed at the second signaling state and an input that is coupled to an output of the flipflop. A reset input of the flipflop may be disabled when filtering glitches from the input signal. In some implementations, the reset input of the flipflop is permanently disabled. In some implementations, the flipflop is non-resettable.

The circuits or modules configured to provide the one or more counter output signals may include a first counter configured to count cycles of the clock signal when the input signal is in the first signaling state, and a second counter configured to count cycles of the clock signal when the input signal is in the second signaling state. In one example, the one or more counter output signals includes a first multibit signal indicative of count value of the first counter, and a second multibit signal indicative of count value of the second counter. The threshold detect circuit may be configured to generate the select signal by comparing the count value of the first counter to the threshold duration and the count value of the second counter to the threshold duration. In another example, the one or more counter output signals includes a first signal that is asserted when the input signal is in the first signaling state for a first threshold duration, and a second signal that is asserted when the input signal is in the second signaling state for a second threshold duration. The threshold detect circuit may be configured to generate the select signal based on a signaling state of the first signal and a signaling state of the second signal.

The circuits or modules configured to provide one or more counter output signals may include a counter configured to count up when the input signal is in the first signaling state and to count down when the input signal is in the second signaling state. In one example, the one or more counter output signals includes a multibit signal indicative of a count value of the counter. The threshold detect circuit may be configured to generate the select signal by comparing the count value of the counter with the threshold duration. In another example, the one or more counter output signals includes a first signal that is asserted when the input signal is in the first signaling state for a first threshold duration, and a second signal that is asserted when the input signal is in the second signaling state for a second threshold duration. The threshold detect circuit may be configured to generate the select signal based on a signaling state of the first signal and a signaling state of the second signal.

The SoC may include a logic circuit configured to provide state information related to operation of the apparatus. The state information may include information indicating that an output of the flipflop is a stable representation of the signaling state of the input signal.

Some implementation examples are described in the following numbered clauses:

1. A glitch filtering circuit, comprising: a counting circuit configured to provide one or more counter output signals indicating whether an input signal has remained in a first signaling state or in a second signaling state for a preconfigured duration of time; a flipflop clocked by a clock signal and configured to provide an output of the glitch filtering circuit; a threshold detect circuit configured to generate a select signal based on the one or more counter output signals; and a multiplexer configured to provide a multiplexed signal to an input of the flipflop, the multiplexed signal having a signaling state that is selected in accordance with the select signal.
2. The glitch filtering circuit as described in clause 1, wherein the counting circuit comprises: a first counter configured to count cycles of the clock signal when the input signal is in the first signaling state; and a second counter configured to count cycles of the clock signal when the input signal is in the second signaling state.
3. The glitch filtering circuit as described in clause 2, wherein the one or more counter output signals comprise: a first multibit signal indicative of an output of the first counter; and a second multibit signal indicative of an output of the second counter, wherein the threshold detect circuit is configured to generate the select signal by comparing the first multibit signal with a first threshold duration and the second multibit signal with a second threshold duration.
4. The glitch filtering circuit as described in clause 2, wherein the one or more counter output signals comprise: a first signal that is asserted when the input signal is in the first signaling state for a first threshold duration; and a second signal that is asserted when the input signal is in the second signaling state for a second threshold duration, wherein the threshold detect circuit is configured to generate the select signal based on a signaling state of the first signal and a signaling state of the second signal.

5. The glitch filtering circuit as described in clause 1, wherein the counting circuit comprises: a counter configured to count up when the input signal is in the first signaling state and to count down when the input signal is in the second signaling state.

6. The glitch filtering circuit as described in clause 5, wherein the one or more counter output signals comprise: a multibit signal indicative of a count value of the counter, wherein the threshold detect circuit is configured to generate the select signal by comparing the multibit signal with a threshold duration.

7. The glitch filtering circuit as described in clause 5, wherein the one or more counter output signals comprise: a first signal that is asserted when the input signal is in the first signaling state for a first threshold duration; and a second signal that is asserted when the input signal is in the second signaling state for a second threshold duration, wherein the threshold detect circuit is configured to generate the select signal based on a signaling state of the first signal and a signaling state of the second signal.

8. The glitch filtering circuit as described in any of clauses 1-7, wherein the multiplexed signal has a signaling state that is selected in accordance with the select signal from an input fixed at the first signaling state, an input fixed at the second signaling state and an input that is coupled to the output of the glitch filtering circuit.

9. The glitch filtering circuit as described in any of clauses 1-8, further comprising: a logic circuit configured to provide state information related to operation of the glitch filtering circuit, wherein the state information includes information indicating that the output of the glitch filtering circuit is a stable representation of the signaling state of the input signal.

10. The glitch filtering circuit as described in any of clauses 1-9, wherein a reset input of the flipflop is disabled.

11. A method for filtering glitches from an input signal, comprising: providing one or more counter output signals indicating whether an input signal has remained in a first signaling state or in a second signaling state for a preconfigured duration of time; generating a select signal based on state of the one or more counter output signals; and providing a multiplexed signal to an input of a flipflop that is clocked by a clock signal, the multiplexed signal having a signaling state that is selected in accordance with the select signal.

12. The method as described in clause 11, wherein providing the one or more counter output signals comprises: providing a first count value by counting cycles of the clock signal when the input signal is in the first signaling state; and providing a second count value by counting cycles of the clock signal when the input signal is in the second signaling state.

13. The method as described in clause 12, wherein the select signal is generated based on comparisons of the first count value and the second count value with the threshold duration.

14. The method as described in clause 12, wherein the select signal is generated using a first signal indicating that the first count value matches the threshold duration, and to a second signal indicating that the second count value matches the threshold duration.

15. The method as described in clause 11, further comprising: incrementing a counter when the input signal is in the first signaling state and decrementing the counter when the input signal is in the second signaling state.

16. The method as described in clause 15, wherein the select signal is generated by comparing a multibit signal indicative of a count value of the counter with the threshold duration.

17. The method as described in clause 15, wherein the select signal is generated by comparing a first signal with a second signal, wherein the first signal is asserted when the input signal is in the first signaling state for a first threshold duration and the second signal is asserted when the input signal is in the second signaling state for a second threshold duration.

18. The method as described in any of clauses 11-17, wherein the multiplexed signal has a signaling state that is selected in accordance with the select signal from an input fixed at the first signaling state, an input fixed at the second signaling state and an input that is coupled to the output of the glitch filtering circuit.

19. The method as described in any of clauses 11-18, further comprising: generating at least one signal representative of state information related to filtering glitches from the input signal, wherein the state information includes information indicating that an output of the flipflop is a stable representation of the signaling state of the input signal.

20. The method as described in any of clauses 11-19, wherein a reset input of the flipflop is disabled.

21. An apparatus for managing access to a power management device, comprising: means for providing one or more counter output signals indicating whether an input signal has remained in a first signaling state or in a second signaling state for a preconfigured duration of time; means for generating a select signal based on state of the one or more counter output signals; and means for providing a multiplexed signal to an input of a flipflop that is clocked by a clock signal, the multiplexed signal having a signaling state that is selected in accordance with the select signal.

22. The apparatus as described in clause 21, wherein the means for providing one or more counter output signals comprises: a first counter configured to count cycles of the clock signal when the input signal is in the first signaling state; and a second counter configured to count cycles of the clock signal when the input signal is in the second signaling state.

23. The apparatus as described in clause 22, wherein the one or more counter output signals comprise: a first multibit signal indicative of count value of the first counter; and a second multibit signal indicative of count value of the second counter, wherein the threshold detect circuit is configured to generate the select signal by comparing the count value of the first counter to the threshold duration and the count value of the second counter to the threshold duration.

24. The apparatus as described in clause 22, wherein the one or more counter output signals comprise: a first signal that is asserted when the input signal is in the first signaling state for a first threshold duration; and a second signal that is asserted when the input signal is in the second signaling state for a second threshold duration, wherein the threshold detect circuit is configured to generate the select signal based on a signaling state of the first signal and a signaling state of the second signal.

25. The apparatus as described in clause 21, wherein the means for providing one or more counter output signals comprises: a counter configured to count up when the input signal is in the first signaling state and to count down when the input signal is in the second signaling state.

26. The apparatus as described in clause 25, wherein the one or more counter output signals comprise: a multibit signal indicative of a count value of the counter, wherein the threshold detect circuit is configured to generate the select signal by comparing the count value of the counter with the threshold duration.

27. The apparatus as described in clause 25, wherein the one or more counter output signals comprise: a first signal that is asserted when the input signal is in the first signaling state for a first threshold duration; and a second signal that is asserted when the input signal is in the second signaling state for a second threshold duration, wherein the threshold detect circuit is configured to generate the select signal based on a signaling state of the first signal and a signaling state of the second signal.

28. The apparatus as described in any of clauses 21-27, wherein the multiplexed signal has a signaling state that is selected in accordance with the select signal from an input fixed at the first signaling state, an input fixed at the second signaling state and an input that is coupled to an output of the flipflop.

29. The apparatus as described in any of clauses 21-28, further comprising: a logic circuit configured to provide state information related to operation of the apparatus, wherein the state information includes information indicating that an output of the flipflop is a stable representation of the signaling state of the input signal.

30. The apparatus as described in any of clauses 21-29, wherein a reset input of the flipflop is disabled.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A glitch filtering circuit, comprising:
   a counting circuit configured to provide one or more counter output signals indicating whether an input signal has remained in a first signaling state or in a second signaling state for a preconfigured duration of time;
   a flipflop clocked by a clock signal and configured to provide an output of the glitch filtering circuit;
   a threshold detect circuit configured to generate a select signal based on the one or more counter output signals; and
   a multiplexer configured to provide a multiplexed signal to an input of the flipflop, the multiplexed signal having a signaling state that is selected in accordance with the select signal.

2. The glitch filtering circuit of claim 1, wherein the counting circuit comprises:
   a first counter configured to count cycles of the clock signal when the input signal is in the first signaling state; and
   a second counter configured to count cycles of the clock signal when the input signal is in the second signaling state.

3. The glitch filtering circuit of claim 2, wherein the one or more counter output signals comprise:
   a first multibit signal indicative of an output of the first counter; and
   a second multibit signal indicative of an output of the second counter,
   wherein the threshold detect circuit is configured to generate the select signal by comparing the first multibit signal with a first threshold duration and the second multibit signal with a second threshold duration.

4. The glitch filtering circuit of claim 2, wherein the one or more counter output signals comprise:
   a first signal that is asserted when the input signal is in the first signaling state for a first threshold duration; and
   a second signal that is asserted when the input signal is in the second signaling state for a second threshold duration,
   wherein the threshold detect circuit is configured to generate the select signal based on a signaling state of the first signal and a signaling state of the second signal.

5. The glitch filtering circuit of claim 1, wherein the counting circuit comprises:
   a counter configured to count up when the input signal is in the first signaling state and to count down when the input signal is in the second signaling state.

6. The glitch filtering circuit of claim 5, wherein the one or more counter output signals comprise:
   a multibit signal indicative of a count value of the counter, wherein the threshold detect circuit is configured to generate the select signal by comparing the multibit signal with a threshold duration.

7. The glitch filtering circuit of claim 5, wherein the one or more counter output signals comprise:
   a first signal that is asserted when the input signal is in the first signaling state for a first threshold duration; and
   a second signal that is asserted when the input signal is in the second signaling state for a second threshold duration,
   wherein the threshold detect circuit is configured to generate the select signal based on a signaling state of the first signal and a signaling state of the second signal.

8. The glitch filtering circuit of claim 1, wherein the multiplexed signal has a signaling state that is selected in accordance with the select signal from an input fixed at the first signaling state, an input fixed at the second signaling state and an input that is coupled to the output of the glitch filtering circuit.

9. The glitch filtering circuit of claim 1, further comprising:
a logic circuit configured to provide state information related to operation of the glitch filtering circuit, wherein the state information includes information indicating that the output of the glitch filtering circuit is a stable representation of the signaling state of the input signal.

10. The glitch filtering circuit of claim 1, wherein a reset input of the flipflop is disabled.

11. A method for filtering glitches from an input signal, comprising:
providing one or more counter output signals indicating whether an input signal has remained in a first signaling state or in a second signaling state for a preconfigured duration of time;
generating a select signal based on state of the one or more counter output signals; and
providing a multiplexed signal to an input of a flipflop that is clocked by a clock signal, the multiplexed signal having a signaling state that is selected in accordance with the select signal.

12. The method of claim 11, wherein providing the one or more counter output signals comprises:
providing a first count value by counting cycles of the clock signal when the input signal is in the first signaling state; and
providing a second count value by counting cycles of the clock signal when the input signal is in the second signaling state.

13. The method of claim 12, wherein the select signal is generated based on comparisons of the first count value with a first threshold duration and comparisons of the second count value with a second threshold duration.

14. The method of claim 12, wherein the select signal is generated using a first signal indicating that the first count value matches a first threshold duration, and using a second signal indicating that the second count value matches a second threshold duration.

15. The method of claim 11, further comprising:
incrementing a counter when the input signal is in the first signaling state and decrementing the counter when the input signal is in the second signaling state.

16. The method of claim 15, wherein the select signal is generated by comparing a multibit signal indicative of a count value of the counter with a threshold duration.

17. The method of claim 15, wherein the select signal is generated by comparing a first signal with a second signal, wherein the first signal is asserted when the input signal is in the first signaling state for a first threshold duration and the second signal is asserted when the input signal is in the second signaling state for a second threshold duration.

18. The method of claim 11, wherein the multiplexed signal has a signaling state that is selected in accordance with the select signal from an input fixed at the first signaling state, an input fixed at the second signaling state and an input that is coupled to an output of the flipflop.

19. The method of claim 11, further comprising:
generating at least one signal representative of state information related to filtering glitches from the input signal, wherein the state information includes information indicating that an output of the flipflop is a stable representation of the signaling state of the input signal.

20. The method of claim 11, wherein a reset input of the flipflop is disabled.

21. An apparatus, comprising:
means for providing one or more counter output signals indicating whether an input signal has remained in a first signaling state or in a second signaling state for a preconfigured duration of time;
means for generating a select signal based on state of the one or more counter output signals; and
means for providing a multiplexed signal to an input of a flipflop that is clocked by a clock signal, the multiplexed signal having a signaling state that is selected in accordance with the select signal.

22. The apparatus of claim 21, wherein the means for providing the one or more counter output signals comprises:
a first counter configured to count cycles of the clock signal when the input signal is in the first signaling state; and
a second counter configured to count cycles of the clock signal when the input signal is in the second signaling state.

23. The apparatus of claim 22, wherein the one or more counter output signals comprise:
a first multibit signal indicative of count value of the first counter; and
a second multibit signal indicative of count value of the second counter,
wherein the threshold detect circuit is configured to generate the select signal by comparing the count value of the first counter to a first threshold duration and the count value of the second counter to a second threshold duration.

24. The apparatus of claim 22, wherein the one or more counter output signals comprise:
a first signal that is asserted when the input signal is in the first signaling state for a first threshold duration; and
a second signal that is asserted when the input signal is in the second signaling state for a second threshold duration,
wherein the threshold detect circuit is configured to generate the select signal based on a signaling state of the first signal and a signaling state of the second signal.

25. The apparatus of claim 21, wherein the means for providing the one or more counter output signals comprises:
a counter configured to count up when the input signal is in the first signaling state and to count down when the input signal is in the second signaling state.

26. The apparatus of claim 25, wherein the one or more counter output signals comprise:
a multibit signal indicative of a count value of the counter, wherein the threshold detect circuit is configured to generate the select signal by comparing the count value of the counter with a threshold duration.

27. The apparatus of claim 25, wherein the one or more counter output signals comprise:
a first signal that is asserted when the input signal is in the first signaling state for a first threshold duration; and
a second signal that is asserted when the input signal is in the second signaling state for a second threshold duration,
wherein the threshold detect circuit is configured to generate the select signal based on a signaling state of the first signal and a signaling state of the second signal.

28. The apparatus of claim 21, wherein the multiplexed signal has a signaling state that is selected in accordance with the select signal from an input fixed at the first signaling state, an input fixed at the second signaling state and an input that is coupled to an output of the flipflop.

29. The apparatus of claim 21, further comprising:
a logic circuit configured to provide state information related to operation of the apparatus, wherein the state information includes information indicating that an output of the flipflop is a stable representation of the signaling state of the input signal.

30. The apparatus of claim 21, wherein a reset input of the flipflop is disabled.

* * * * *